United States Patent
Kim et al.

(10) Patent No.: US 12,543,466 B2
(45) Date of Patent: Feb. 3, 2026

(54) COLOR CONVERSION MEMBER AND DISPLAY DEVICE COMPRISING SAME

(71) Applicant: Samsung Display Co., Ltd., Yongin-si (KR)

(72) Inventors: Min-Hee Kim, Ansan-si (KR); Sunyoung Kwon, Seoul (KR); Min-Jae Kim, Suwon-si (KR); Taehoon Kim, Suwon-si (KR); Kyunghae Park, Seongnam-si (KR); Joon-Hyung Park, Seoul (KR); Danbi Yang, Gunpo-si (KR); Hanjun Yu, Seoul (KR); Dokyung Youn, Cheonan-si (KR); Chang-Hun Lee, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 576 days.

(21) Appl. No.: 17/774,691

(22) PCT Filed: Apr. 29, 2020

(86) PCT No.: PCT/KR2020/005715
§ 371 (c)(1),
(2) Date: May 5, 2022

(87) PCT Pub. No.: WO2021/137360
PCT Pub. Date: Jul. 8, 2021

(65) Prior Publication Data
US 2022/0392961 A1    Dec. 8, 2022

(30) Foreign Application Priority Data
Dec. 31, 2019  (KR) .................. KR10-2019-0179108

(51) Int. Cl.
*H10K 59/38* (2023.01)

(52) U.S. Cl.
CPC .................................. *H10K 59/38* (2023.02)

(58) Field of Classification Search
CPC .. H10K 59/38; H10K 2102/331; H10K 59/35; H10K 50/80; H10K 59/122
See application file for complete search history.

(56) References Cited

U.S. PATENT DOCUMENTS

| | | | |
|---|---|---|---|
| 6,043,604 A | 3/2000 | Horiuchi et al. | |
| 7,199,393 B2 | 4/2007 | Park et al. | |

(Continued)

FOREIGN PATENT DOCUMENTS

| | | |
|---|---|---|
| CN | 114335084 A | 4/2022 |
| EP | 3435149 A1 | 1/2019 |

(Continued)

OTHER PUBLICATIONS

International Search Report mailed Sep. 28, 2020 for PCT/KR2020/005715.

*Primary Examiner* — S M Sohel Imtiaz
(74) *Attorney, Agent, or Firm* — CANTOR COLBURN LLP

(57) ABSTRACT

A color conversion member includes: a first sub-partition part having a width which decreases from a first surface toward a second surface; a second sub-partition part disposed on the first sub-partition part and having a width which increases from the first sub-partition part toward the second surface; and a partition part which is disposed on the second sub-partition part and includes a liquid-repellent part including a liquid-repellent additive.

26 Claims, 16 Drawing Sheets

(56) References Cited

U.S. PATENT DOCUMENTS

| | | | |
|---|---|---|---|
| 8,040,470 | B2 | 10/2011 | Kashiwagi |
| 8,083,956 | B2 * | 12/2011 | Fujii .................. H10K 71/13 |
| | | | 438/700 |
| 8,633,644 | B2 | 1/2014 | Yamamoto et al. |
| 9,105,876 | B2 * | 8/2015 | Choi .................. H10K 71/135 |
| 10,185,066 | B2 | 1/2019 | Chae et al. |
| 10,976,592 | B2 | 4/2021 | Kim et al. |
| 12,082,431 | B2 | 9/2024 | Ahn et al. |
| 2016/0372528 | A1 | 12/2016 | Kamura et al. |
| 2017/0153368 | A1 * | 6/2017 | Yoon .................. G02B 5/28 |
| 2018/0210282 | A1 * | 7/2018 | Song .................. G02B 5/22 |
| 2019/0018286 | A1 | 1/2019 | Kim et al. |
| 2019/0137815 | A1 * | 5/2019 | Kim .................. H10K 50/171 |
| 2019/0237452 | A1 * | 8/2019 | Kuo .................. H10H 20/855 |

FOREIGN PATENT DOCUMENTS

| | | |
|---|---|---|
| JP | 2002006129 A | 1/2002 |
| JP | 2003229261 A | 8/2003 |
| JP | 2007095630 A | 4/2007 |
| JP | 2007227289 A | 9/2007 |
| JP | 2008140735 A | 6/2008 |
| JP | 2009110945 A | 5/2009 |
| JP | 2013057059 A | 3/2013 |
| JP | 201564391 A | 4/2015 |
| JP | 2016164855 A | 9/2016 |
| JP | 2019168588 A | 10/2019 |
| JP | 2019179111 A | 10/2019 |
| KR | 100508603 B1 | 9/2005 |
| KR | 1020080077396 A | 8/2008 |
| KR | 1020120001719 A | 1/2012 |
| KR | 1020170032318 A | 3/2017 |
| KR | 1020180018945 A | 2/2018 |
| KR | 1020180087502 A | 8/2018 |
| KR | 1020190008493 A | 1/2019 |
| KR | 1020190050886 A | 5/2019 |
| KR | 1020190114822 A | 10/2019 |
| TW | 201311833 A1 | 3/2013 |
| TW | 201942671 A | 11/2019 |
| WO | 2010032514 A1 | 3/2010 |
| WO | 2013024764 A | 2/2013 |
| WO | 2019146680 A1 | 8/2019 |

* cited by examiner

COLOR CONVERSION MEMBER AND DISPLAY DEVICE COMPRISING SAME

TECHNICAL FIELD

Embodiments of the invention relate to a color conversion member and a display device including the color conversion member, and more particularly, a color conversion member including a quantum dot and a display device including the color conversion member.

BACKGROUND ART

Various display devices used in multimedia devices such as televisions, mobile phones, tablet computers, navigation units, and game consoles have been developed. When the display devices are manufactured, a color control part may be desired to be patterned, and partitions may be used to distinguish the color control parts when patterned.

Here, the partitions are surface-treated to have a liquid repellency, thereby improving a pattern formation quality of the color control parts and preventing color mixture between the neighboring color control parts in a process of providing the color control parts between the partitions.

DISCLOSURE OF THE INVENTION

Technical Problem

Embodiments of the invention provide a color conversion member having an improved durability and pattern formation quality of a color control part by arranging a liquid-repellent part only on a partition part.

Embodiments of the invention also provide a display device having improved display quality by including a color conversion member including a partition part of which a top surface has liquid repellency.

Technical Solution

An embodiment of the invention provides a color conversion member including: a base layer; a plurality of partition parts spaced apart from each other on the base layer; and a color control part disposed between the partition parts, each of the partition parts has a first surface adjacent to the base layer, a second surface opposite to the first surface, and a third surface connected between the first surface and the second surface, where the third surface includes a recessed portion, and each of the partition parts includes: a first sub-partition part having a width which gradually decreases in a direction from the first surface to the second surface; a second sub-partition part disposed on the first sub-partition part and having a width which gradually increases in a direction from the first sub-partition part to the second surface; and a liquid-repellent part disposed on the second sub-partition part and including a liquid-repellent additive.

In an embodiment, the liquid-repellent part may have a surface energy less than a surface energy of the color control part, and each of the first sub-partition part and the second sub-partition part may have a surface energy greater than the surface energy of the color control part.

In an embodiment, a top surface of the liquid-repellent part may be the second surface, the second surface may have a surface energy less than a surface energy of the third surface, and a difference between the surface energy of the second surface and the surface energy of the third surface may be equal to or greater than about 10 dynes per centimeter (dyn/cm).

In an embodiment, when a connected portion between the first sub-partition part and the second sub-partition part has a width of $W_1$, and the second sub-partition part has a maximum width of $W_2$, $W_1$ and $W_2$ may satisfy the following inequation: $1.5\ \mu m \leq W_2 - W_1 \leq 3.5\ \mu m$.

In an embodiment, when a connected portion between the first sub-partition part and the second sub-partition part has a width of $W_1$, the second sub-partition part has a maximum width of $W_2$, and a maximum height in a thickness direction of each of the partition parts is $H_{BK}$, $W_1$, $W_2$ and $H_{BK}$ may satisfy the following inequation: $0.1 \leq (W_2 - W_1)/H_{BK} < 0.48$.

In an embodiment, on a cross-section of each of the partition parts perpendicular to the base layer, a maximum width $W_3$ of the first sub-partition part may be equal to or greater than a maximum width $W_2$ of the second sub-partition part.

In an embodiment, when a maximum height in a thickness direction of each of the partition parts is $H_{BK}$, and a maximum height in a thickness direction of the color control part is $H_{CP}$, $H_{BK}$ and $H_{CP}$ may satisfy the following inequation: $0.7 * H_{BK} \leq H_{CP} \leq 1.3 * H_{BK}$.

In an embodiment, a height in a thickness direction of each of the partition parts may be equal to or greater than about 5 μm and equal to or less than about 20 μm, and a height of the second sub-partition part may be two times or more of a height of the first sub-partition part.

In an embodiment, each of the partition parts may further include a third sub-partition part disposed between the second sub-partition part and the liquid-repellent part and having a width which gradually decreases in a direction from the second sub-partition part to the liquid-repellent part.

In an embodiment, an edge of a top surface of the third sub-partition part may be a curved surface.

In an embodiment, on a cross-section of each of the partition parts perpendicular to the base layer, the third sub-partition part may include a flat portion having a flat top surface and a curved portion disposed on a side surface of the flat portion, and the curved portion may have a width which gradually decreases in the direction from the second sub-partition part to the liquid-repellent part.

In an embodiment, the curved portion may include: a first curved portion disposed at one side of the flat portion; and a second curved portion symmetric to the first curved portion based on the flat portion and disposed at an opposing side of the flat portion.

In an embodiment, when, on the cross-section, the second sub-partition part has a maximum width of $W_2$, and the curved portion has a maximum width of $W_{CP}$, $W_2$ and $W_{CP}$ may satisfy the following inequation: $W_{CP} \leq 0.4 * W_2$.

In an embodiment, an edge of a top surface of the color control part may overlap the curved portion.

In an embodiment, when a maximum width of the second sub-partition part is $W_2$, and a maximum height from the second sub-partition part to a top surface of the third sub-partition part is $H_C$, $W_2$ and $H_C$ satisfy the following inequation: $0 \leq H_C/(W_2/2) \leq 0.5$.

In an embodiment, a height in a thickness direction of the third sub-partition part may be about 30% or less of a height in a thickness direction of each of the partition parts.

In an embodiment, each of the partition parts may further include a fourth sub-partition part disposed on the third sub-partition part and having a width which gradually decreases in a direction from the third sub-partition part to the liquid-repellent part and a fifth sub-partition part disposed between the fourth sub-partition part and the liquid-repellent part and having a width which gradually increases in the direction from the third sub-partition part to the liquid-repellent part.

In an embodiment, when a connected portion between the fourth sub-partition part and the fifth sub-partition part has a width of $W_4$, the fifth sub-partition part has a maximum width of $W_5$, and a distance in a thickness direction from the third sub-partition part to a maximum height of the partition part is $H_{BK-3}$, $W_4$, $W_5$ and $H_{BK-3}$ may satisfy the following inequation: $0.1 \leq (W_5-W_4)/H_{BK-3} < 0.48$.

In an embodiment, the liquid-repellent additive may be a copolymer including a perfluoropolyether ("PFPE") derivative as a side chain.

In an embodiment, a weight of the liquid-repellent additive may be equal to or greater than about 0.01 wt % and equal to or less than about 10 wt % based on a total weight of each of the partition parts.

In an embodiment, on a cross-section of each of the partition parts, a side surface of the second sub-partition part may have an inclined angle greater than about 90° to the base layer.

In an embodiment, the color control part may include a quantum dot.

In an embodiment, the color control part may include: a first color control part which transmits first color light therethrough; a second color control part including a first quantum dot which converts the first color light into second color light in a longer wavelength region than the first color light; and a third color control part including a second quantum dot which converts the first color light into third color light in a longer wavelength region than each of the first color light and the second color light.

In an embodiment, each of the partition parts may include a pigment or a dye.

In an embodiment, the color conversion member may further include a color filter layer disposed between the base layer and the color control part, and the color filter layer may include: a plurality of light shielding parts; and a filter disposed between the light shielding parts In an embodiment, the light shielding parts may overlap the partition parts, respectively.

In an embodiment of the invention, a display device includes: a display panel; and a color conversion member disposed on the display panel, the color conversion member includes: a plurality of partition parts disposed on the display panel and spaced apart from each other; and a color control part disposed between the partition parts, each of the partition parts has a first surface adjacent to the base layer, a second surface opposite to the first surface, and a third surface connected between the first surface and the second surface, where the third surface includes a recessed portion, and each of the partition parts includes: a first sub-partition part having a width that gradually decreases in a direction from the first surface to the second surface; a second sub-partition part disposed on the first sub-partition part and having a width which gradually increases in a direction from the first sub-partition part to the second surface; and a liquid-repellent part disposed on the second sub-partition part and including a liquid-repellent additive.

In an embodiment, the display panel may provide first color light.

In an embodiment, the color control part may include: a first color control part which transmits first color light therethrough; a second color control part including a first quantum dot which converts the first color light into second color light in a longer wavelength region than the first color light; and a third color control part including a second quantum dot which converts the first color light into third color light in a longer wavelength region than each of the first color light and the second color light, and the first to third color control parts may be spaced apart from each other on a plane.

In an embodiment, the color conversion member may further include a color filter layer disposed on the color control part, and the color filter layer may include: a first filter which transmits first color light therethrough; a second filter which transmits second color light therethrough; a third filter which transmits third color light therethrough; and a light shielding part disposed between the first to third filters.

In an embodiment, the display panel may include a plurality of pixel defining layers and an organic electroluminescence element disposed between the pixel defining layers, and the pixel defining layers may overlap the partition parts, respectively.

Advantageous Effects

The color conversion member according to an embodiment may prevent the color mixture between the neighboring color control parts by providing the color control part between the partition parts of which the top surface has the liquid repellency and exhibit high reliability by increasing the adhesion force between the color control part and the side surface of the partition part.

Also, the display device according to an embodiment may exhibit high display quality and improved reliability by including the color conversion member including the color control parts having the satisfactory pattern characteristics.

MODE FOR CARRYING OUT THE INVENTION

Figure 1:
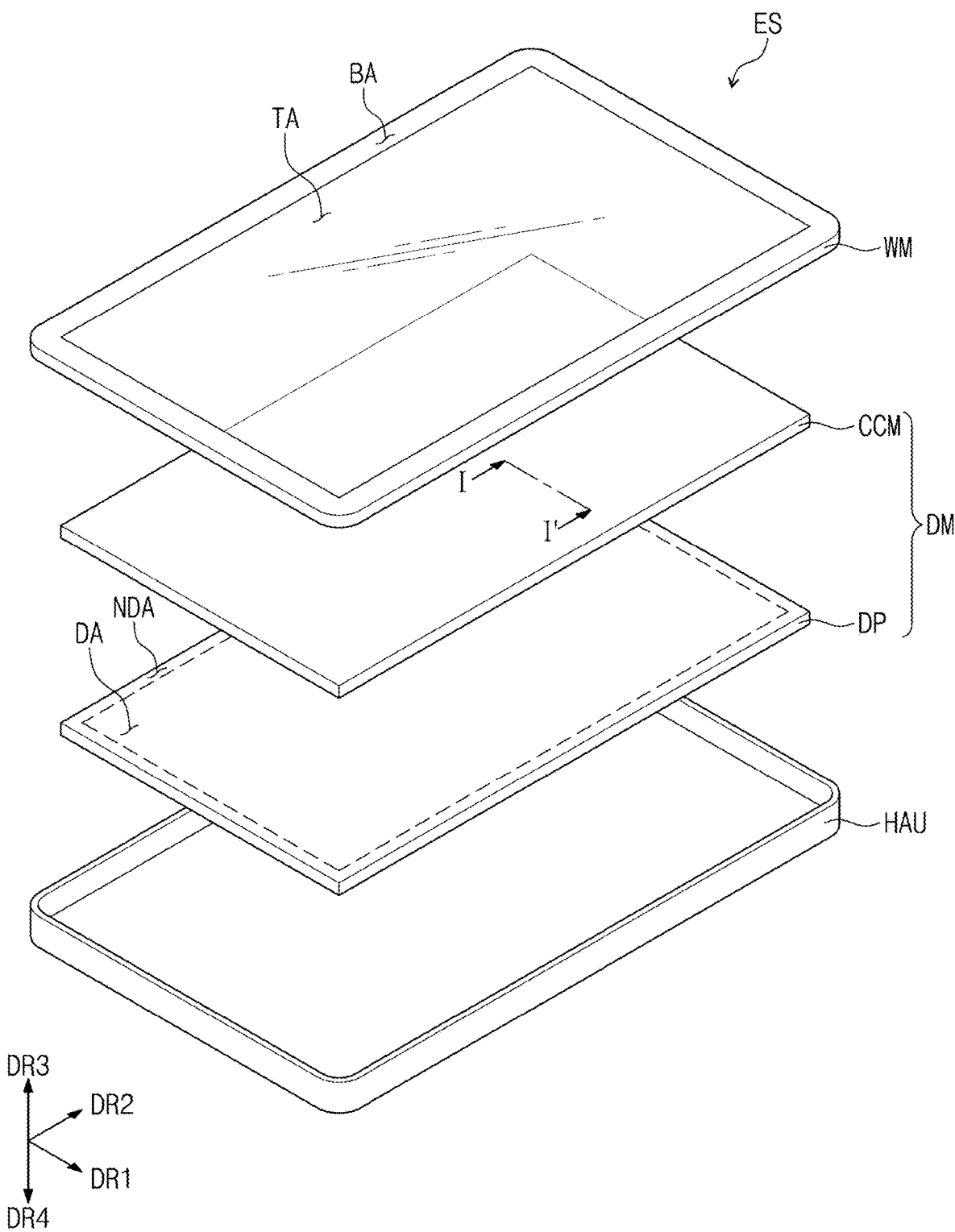
FIG. 1 is an exploded perspective view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will also be understood that when one component (or region, layer, portion) is referred to as being 'on', 'connected to', or 'coupled to' another component, it can be directly disposed/connected/coupled on/to the one component, or an intervening third component may also be present.

In this application, it will be understood that when a layer, a film, a region, or a plate is "directly contact" another layer, film, region, or plate, further another layer, film, region, or plate is not present therebetween. It will also be understood that when an element or layer is referred to as being 'on' another one, it can be directly on the other one, or one or more intervening elements or layers may also be present.

Like reference numerals refer to like elements throughout. Also, in the figures, the dimensions of components are exaggerated for clarity of illustration.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that although the terms of first and second are used herein to describe various elements, these elements should not be limited by these terms. The terms are only used to distinguish one component from other components. For example, a first element referred to as a first element in one embodiment can be referred to as a second element in another embodiment. The terms of a singular form may include plural forms unless referred to the contrary.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a color conversion member and a display device including the color conversion member according to an embodiment of the invention will be described with reference to the accompanying drawings.

Figure 2:
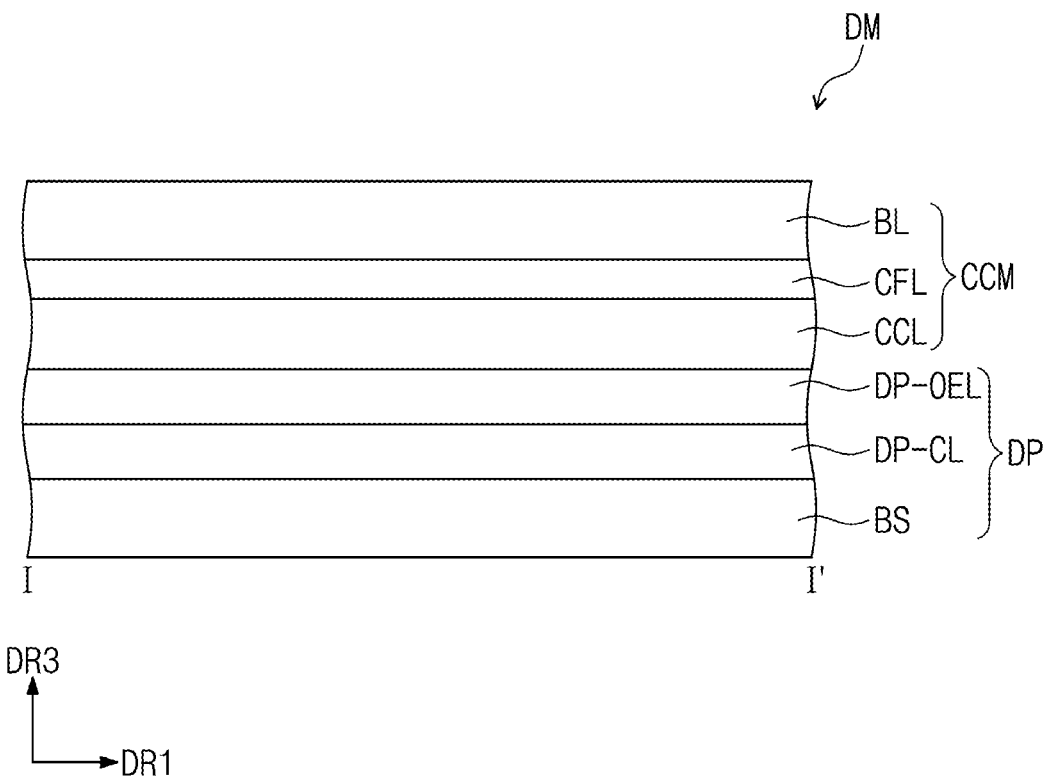
FIG. 2 is a cross-sectional view taken along line I-I' of FIG. 1 and illustrating a display module according to an embodiment.

FIG. 1 is an exploded perspective view illustrating a display device ES according to an embodiment of the invention. FIG. 2 is a cross-sectional view taken along line I-I' of FIG. 1. FIG. 2 is a cross-sectional view illustrating a display module DM according to an embodiment of the invention.

In an embodiment, the display device ES may be a large-sized display device such as a television, a monitor, or an outdoor advertisement board. In an alternative embodiment, the display device ES may be a small and medium-sized display device such as a personal computer, a notebook computer, a personal digital terminal, a navigation unit for a vehicle, a game console, a smartphone, a tablet computer, and a camera. The above-described devices are merely an embodiment, and thus, the display device ES may be adopted for other types of display device unless departing from the spirit and scope of the invention.

The display device ES according to an embodiment may include a window WM, a display module DM, and a housing HAU. The display module DM may include a display panel DP that is a display element. Although not shown in the drawings, the display device ES may include various elements such as a touch element or a detection element, which is activated by an electrical signal, in addition to the display element.

Although a first direction DR1 to a fourth direction DR4 (or a first directional axis DR1 to a fourth directional axis DR4) are illustrated in FIG. 1 and drawings below, directions indicated by the first to fourth directions DR1, DR2, DR3, and DR4, as relative concepts, may be converted with respect to each other.

In this specification, the third direction DR3 is defined as a direction in which an image is provided to a user for convenience of description. Also, a direction opposite to the third direction DR3 in a thickness direction of the display device ES indicates the fourth direction DR4. Also, the first direction DR1 and the second direction DR2 are perpendicular to each other, and each of the third direction DR3 and the fourth direction DR4 is a normal direction to a plane defined by the first and second directions DR1 and DR2. In FIG. 1, a display surface may be on the plane defined by the first and second directions DR1 and DR2.

In the display device ES according to an embodiment, the window WM may be disposed on the display module DM. The window WM may include or be made of a material including or containing glass, sapphire, or plastic. The window WM includes a light transmitting area TA which transmits an image provided from the display module DM therethrough and a light shielding area BA which is adjacent to the light transmitting area TA and through which the image is not transmitted. In an alternative embodiment, the window WM may be omitted in the display device ES.

In the display device ES according to an embodiment, the display module DM may be disposed below the window WM. The display module DM may include a display panel DP and a color conversion member CCM disposed on the display panel DP.

The display panel DP may be a light emitting display panel. In an embodiment, for example, the display panel DP may be a light-emitting diode display panel, an organic electroluminescence display panel, or a quantum-dot light emitting display panel. However, the embodiment of the invention is not limited thereto.

The light-emitting diode display panel may include a light emitting diode, the organic electroluminescence display panel may include a light emitting layer including or containing an organic electroluminescence light emitting material, and the quantum-dot light emitting display panel may include a light emitting layer including or containing a quantum dot or a quantum rod. Hereinafter, for convenience of description, embodiments where the display panel DP in the display device ES is the organic electroluminescence display panel will be described in detail. However, the embodiment of the invention is not limited thereto.

In such embodiments, the display device ES may include the display panel DP and the color conversion member CCM, and the display device ES may be an organic electroluminescence display device including the organic electroluminescence display panel. The display panel DP may provide first color light. In an embodiment, for example, the display panel DP may emit blue light.

The color conversion member CCM may convert a wavelength of light provided from the display panel DP or transmit the light provided from the display panel DP therethrough without converting the wavelength thereof. The color conversion member CCM may convert a wavelength of blue light provided from the display panel DP or transmit the blue light therethrough.

On a plane, that is, when viewed from a plan view, one surface of the display panel DP, on which an image is displayed, is defined as a display surface. The display surface includes a display area DA on which an image is displayed and a non-display area NDA on which an image is not displayed. The display area DA is disposed on a central portion of the display panel DP on the plane to overlap the light transmitting area TA of the window WM.

The housing HAU may be disposed below the display panel DP to accommodate the display panel DP. The housing HAU may cover the display panel DP to expose a top surface of the display panel DP, which is the display surface. The housing HAU may cover a side surface and a bottom surface of the display panel DP and expose the entire top surface.

Referring to FIG. 2, the display panel DP may include a base substrate BS, a circuit layer DP-CL disposed on the base substrate BS, and a display element layer DP-OEL. In an embodiment, the base substrate BS, the circuit layer DP-CL, and the display element layer DP-OEL may be sequentially laminated or disposed in a direction of a third directional axis DR3.

The base substrate BS may provide a base surface on which the display element layer DP-OEL is disposed. The base substrate BS may be a glass substrate, a metal substrate, or a plastic substrate. However, the embodiment of the invention is not limited thereto. In an alternative embodiment, for example, the base substrate BS may be an inorganic layer, an organic layer, or a composite material layer.

In an embodiment, the circuit layer DP-CL may be disposed on the base substrate BS and include a plurality of transistors (not shown). Each of the transistors (not shown) may include a control electrode, an input electrode, and an output electrode. In an embodiment, for example, the circuit layer DP-CL may include a switching transistor and a driving transistor for driving an organic electroluminescence element OEL (refer to FIG. 12) of the display element layer DP-OEL.

The color conversion member CCM is disposed on the display panel DP. The color conversion member CCM may include a color conversion layer CCL, a color filter layer CFL, and a base layer BL. In an embodiment, for example, the display panel DP may include the organic electroluminescence element OEL (refer to FIG. 12) for emitting the first color light, and the color conversion member CCM may include a color control part CCP (refer to FIG. 3) that converts a wavelength of the first color light provided from the organic electroluminescence element OEL (refer to FIG. 12) or transmits the first color light therethrough.

Figure 3:
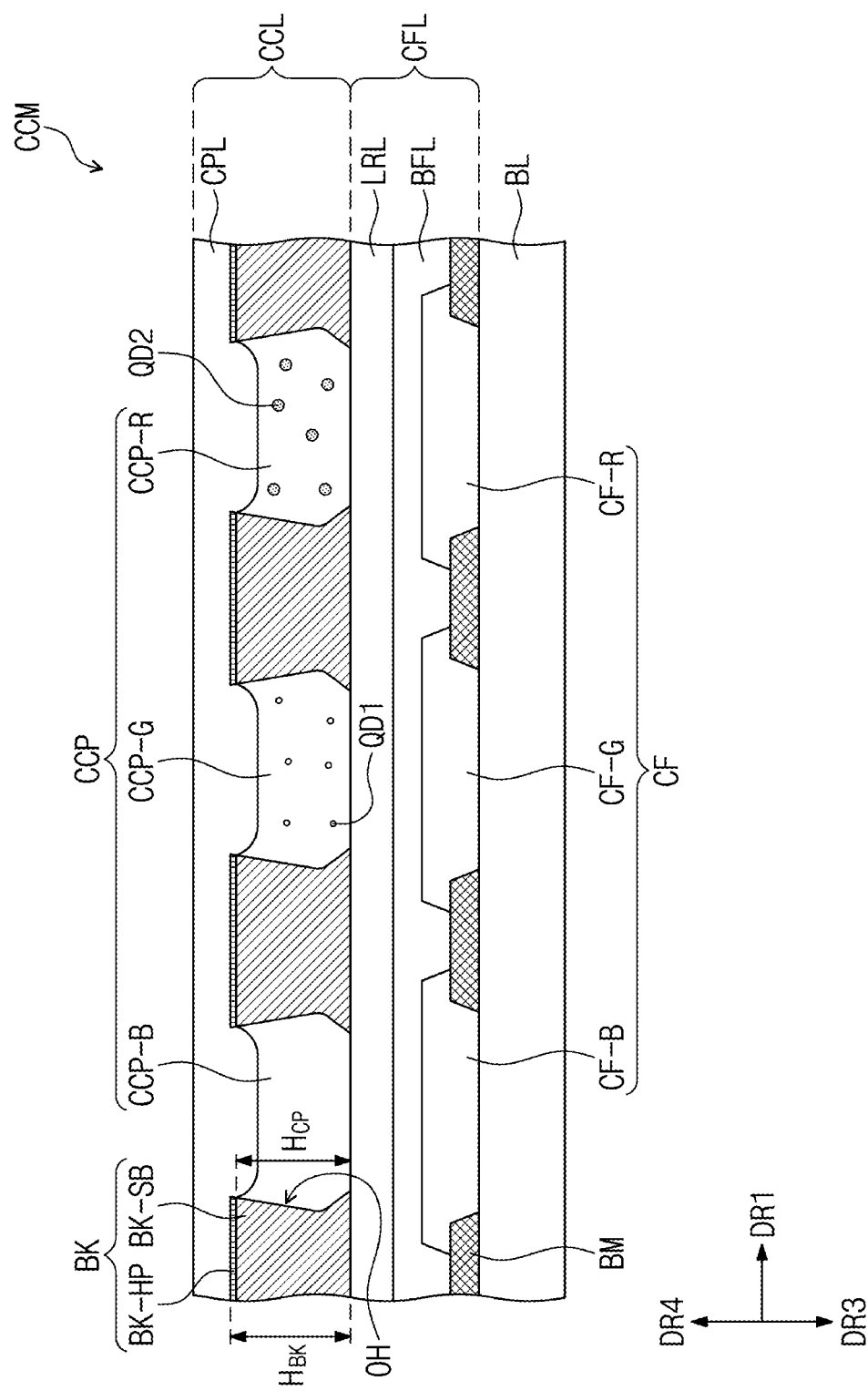
FIG. 3 is a cross-sectional view illustrating a color conversion member according to an embodiment.
Figure 4:
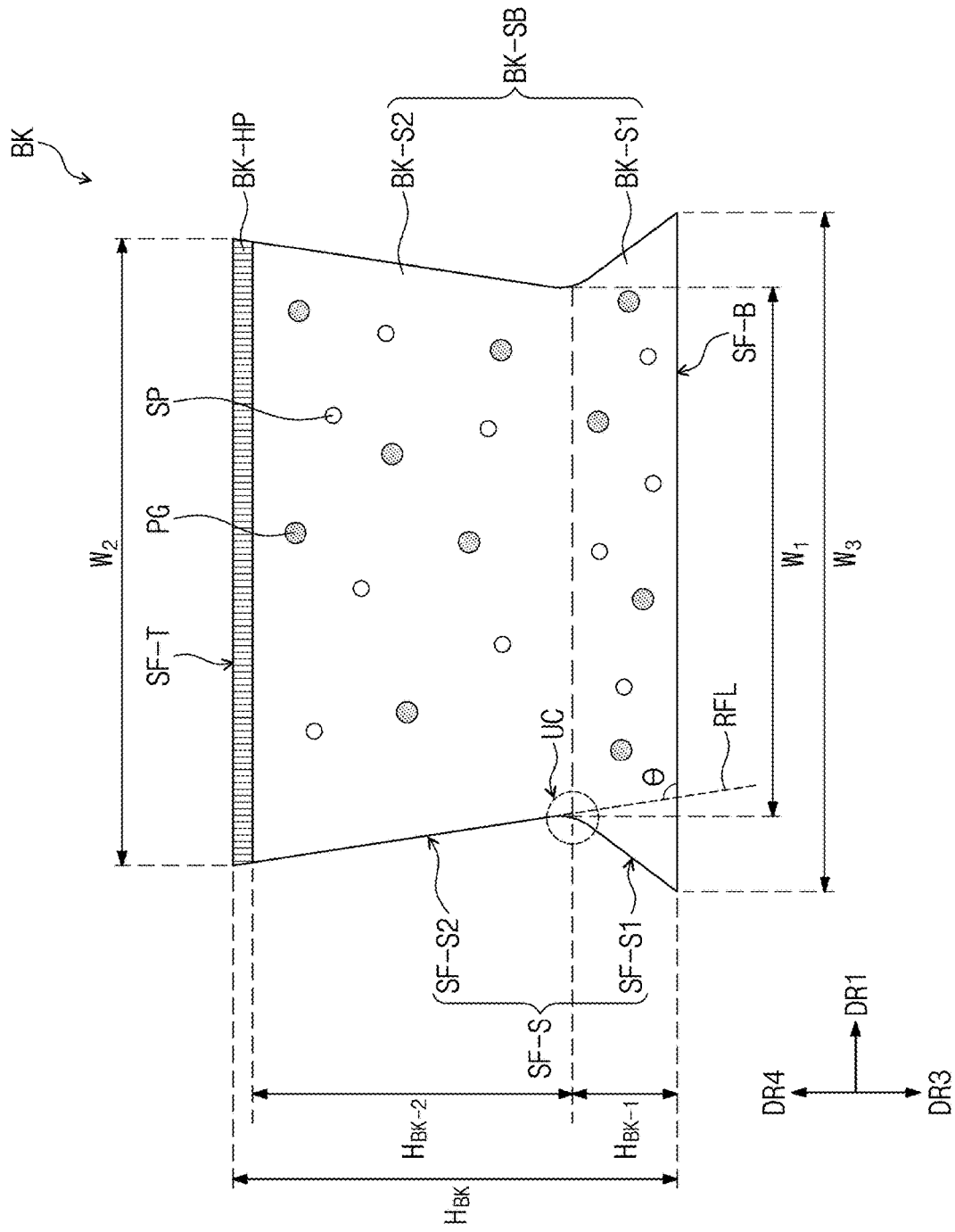
FIG. 4 is a cross-sectional view illustrating a partition part according to an embodiment.
Figure 5:
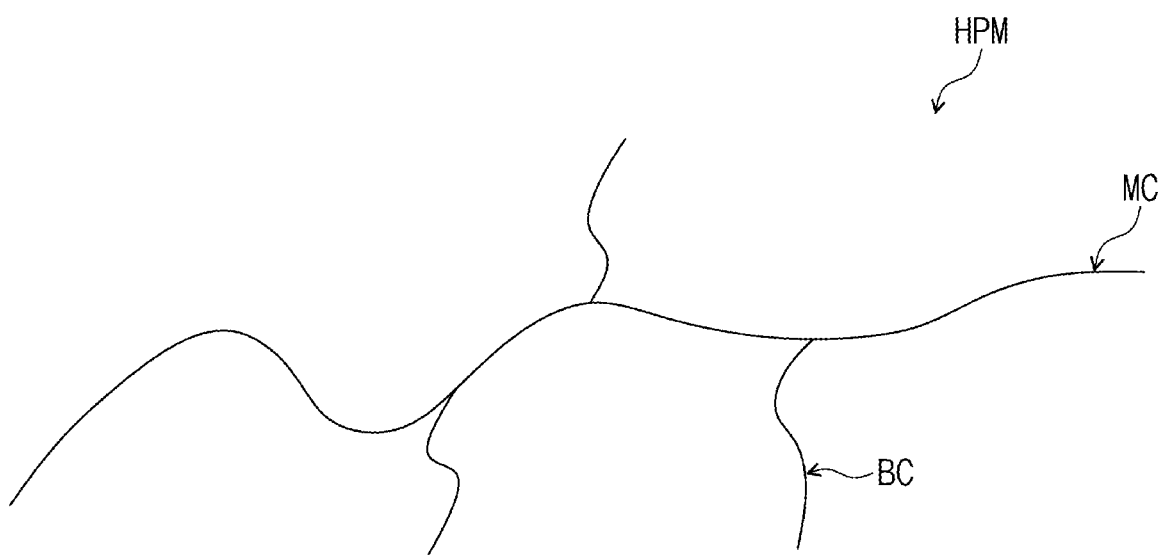
FIG. 5 is a schematic view illustrating a liquid-repellent additive according to an embodiment.

FIG. 3 is a cross-sectional view illustrating the color conversion member CCM according to an embodiment. FIG. 4 is a cross-sectional view illustrating a partition part BK according to an embodiment. Each of the cross-sectional views of FIGS. 3 and 4 is parallel to a surface defined by a first directional axis DR1 and a fourth directional axis DR4. FIG. 5 is a schematic view illustrating a structure of a liquid-repellent additive HPM used in an embodiment.

Referring to FIG. 3, an embodiment of the color conversion member CCM includes a base layer BL and a color conversion layer CCL disposed on the base layer BL. The color conversion layer CCL may include a plurality of partition parts BK spaced apart from each other and a color control part CCP disposed between the partition parts BK. That is, the color conversion member CCM according to an embodiment may include the base layer BL, the plurality of partition parts BK disposed on the base layer BL, and the color control part CCP disposed between the plurality of partition parts BK.

Also, the color conversion member CCM according to an embodiment may further include a color filter layer CFL. The color filter layer CFL may be disposed between the base layer BL and the color conversion layer CCL.

The base layer BL may provide a base surface on which the color filter layer CFL and the color conversion layer CCL are disposed. The base layer BL may be a glass substrate, a metal substrate, or a plastic substrate. However, the embodiment of the invention is not limited thereto. In an alternative embodiment, for example, the base layer BL may be an inorganic layer, an organic layer, or a composite material layer. The base layer BL may correspond to a portion of a component disposed on the display panel DP among various components in the display device ES.

The color conversion layer CCL is disposed on the base layer BL. The color conversion layer CCL may include the plurality of partition parts BK and color control parts CCP-B, CCP-G, and CCP-R disposed between the partition parts BK.

The partition parts BK may define openings OH exposing a top surface of the color filter layer CFL disposed below the color conversion layer CCL. That is, the openings OH may be defined through the partition parts BK to expose the top surface of the color filter layer CFL disposed below the color conversion layer CCL. The color control parts CCP-B, CCP-G, and CCP-R may be disposed or filled in the openings OH.

Referring to FIG. 4, the partition part BK according to an embodiment may have a first surface SF-B disposed adjacent to the base layer BL, a second surface SF-T facing the first surface SF-B, and a third surface SF-S connecting the first surface SF-B and the second surface SF-T to each other, or extending from the first surface SF-B to the second surface SF-T. The third surface SF-S corresponding to a side surface of the partition part BK may include a recessed portion UC. The recessed portion UC may be a curved surface that is recessed in a central direction of the partition part BK.

Although the third surface SF-S is shown by a straight line on a cross-section in FIG. 4 for convenience of illustration, the third surface SF-S may be a curved surface within a range of maintaining shapes of sub-partition parts BK-S1 and BK-S2.

Also, the partition part BK may include a first sub-partition part BK-S1, a second sub-partition part BK-S2, and a liquid-repellent part BK-HP. The first sub-partition part BK-S1 that is disposed adjacent to the base layer BL may have a width that gradually decreases in a direction from the first surface SF-B adjacent to the base layer BL to the second surface SF-T that is a top surface of the partition part BK. The second sub-partition part BK-S2 that is disposed on the first sub-partition part BK-S1 while neighboring with the first sub-partition part BK-S1 may have a width that gradually increases in a direction from the first sub-partition part BK-S1 to the second surface SF-T. The liquid-repellent part BK-HP may be disposed on the second sub-partition part BK-S2 and include a liquid-repellent additive.

Also, the partition part BK may include the first sub-partition part BK-S1, the second sub-partition part BK-S2, and the liquid-repellent part BK-HP, which are sequentially laminated or disposed one on another in a direction of the fourth directional axis DR4 that is the thickness direction of the display device ES. The partition part BK may include the liquid-repellent part BK-HP and a base partition part BK-SB. The liquid-repellent part BK-HP may provide the second surface SF-T that is the top surface of the partition part BK. That is, a top surface of the liquid-repellent part BK-HP may be the second surface SF-T that is the top surface of the partition part BK. The base partition part BK-SB corresponds to a portion including the sub-partition parts BK-S1 and BK-S2 occupying most of the partition part BK.

The partition part BK may include a polymer resin and a liquid-repellent additive. In an embodiment, the partition part BK may include a polyacrylate-based resin or a polyimide-based resin.

Also, the partition part BK may further include an inorganic material in addition to the polymer resin. The partition part BK may further include a scattering agent SP distributed in the polymer resin. The scattering agent SP may be inorganic particles. In an embodiment, for example, the scattering agent SP may include at least one selected from $TiO_2$, $ZnO$, $Al_2O_3$, $SiO_2$, and hollow silica.

The partition part BK may include or contain the liquid-repellent additive at a weight ratio equal to or greater than about 0.01 weight percent (wt %) and equal to or less than about 10 wt % based on a total weight of the partition part BK. That is, the liquid-repellent additive may be contained at a weight ratio equal to or greater than about 0.01 wt % and equal to or less than about 10 wt % based on a total weight of a solid content of a resin composition of the partition part BK. If a content of the liquid-repellent additive in the partition part BK is less than about 0.01 wt %, a liquid repellency may not be sufficiently realized. Also, if the content of the liquid-repellent additive is greater than about 10 wt %, a coatability of the resin composition supplied when the partition part BK is provided may be degraded, and the provided partition part BK may not exhibit a uniform surface property.

The liquid-repellent additive may include the liquid-repellent part BK-HP. That is, the first sub-partition part BK-S1 and the second sub-partition part BK-S2 in the partition part BK may include or be made of the polymer resin, and the liquid-repellent part BK-HP may include or be made of the polymer resin and the liquid-repellent additive. The liquid-repellent additive may be mainly contained in the liquid-repellent part BK-HP. The base partition part BK-SB may not include the liquid-repellent additive or may include an extremely small amount of liquid-repellent additive.

The partition part BK may include a light absorbing material or include a pigment or a dye PG. In an embodiment, for example, the partition part BK may realize a black partition part by including a black pigment or a black dye. In an embodiment, carbon black or the like may be used as the black pigment or the black dye when the black partition part is provided, but the embodiment of the invention is not limited thereto. Alternatively, the partition part BK may include a red pigment or a red dye. In an embodiment where the partition part BK includes the red pigment or the red dye, the partition part BK may absorb light in a short wavelength region to improve a color quality of the color conversion member CCM in comparison with a case of including a green or blue pigment or a green or blue dye.

Although the partition part BK may have a black color, a violet color, or a red color by further including the pigment or the dye PG, the embodiment of the invention is not limited thereto. The partition part BK further including the pigment or the dye may have an increased optical density to absorb a portion of light generated from the neighboring color control part CCP. Thus, the partition part BK further including the pigment or the dye according to an embodiment may have an optical density of about 2.0 or more and exhibit color gamut of about 90% or more in comparison with the DCI color coordinates. That is, the color conversion member CCM according to an embodiment may exhibit high color gamut by including the partition part BK further including the pigment or the dye PG.

FIG. 5 is a schematic view illustrating the structure of the liquid-repellent additive HPM used when the partition part BK according to an embodiment is provided. The liquid-repellent additive HPM may be a copolymer including a main chain MC and a side chain BC. The side chain BC may be a perfluoropolyether ("PFPE") derivative.

Referring back to FIGS. 3 and 4, the liquid-repellent part BK-HP may have a low surface energy value by including the liquid-repellent additive. Surface energy of the liquid-repellent part BK-HP may be adjusted in consideration of surface energy of a color control part resin disposed between the partition parts BK to provide the color control part CCP. The surface energy of the liquid-repellent part BK-HP may be less than that of the color control part resin, and surface energy of each of the first and second sub-partition parts BK-S1 and BK-S2 may be greater than that of the color control part resin.

Also, the surface energy of the liquid-repellent part BK-HP may be less than that of the color control part CCP, and the surface energy of each of the first and second sub-partition parts BK-S1 and BK-S2 may be greater than that of the color control part CCP.

The second surface SF-T may have surface energy less than that of the third surface SF-S that is the side surface of the partition part BK. In an embodiment, for example, a difference between the surface energy of the second surface SF-T and the surface energy of the third surface SF-S may be equal to or greater than about 10 dynes per centimeter (dyn/cm). Specifically, the second surface SF-T of the partition part BK may have surface energy equal to or less than 20 dyn/cm, and the third surface SF-S of the partition part BK may have surface energy equal to or greater than 30 dyn/cm. In an embodiment, for example, the second surface SF-T of the partition part BK may have a hydrophobic property, and the third surface SF-S that is the side surface may have a hydrophilic property.

As the partition part BK has the third surface SF-S having the surface energy greater in value than that of the color control part CCP and the second surface SF-T having the surface energy less in value than that of the color control part CCP, the neighboring color control parts CCP may be clearly distinguished by using the partition part BK as a boundary, and an adhesion force between the color control part CCP and the partition part BK in the opening OH may be improved, so that the color quality and durability of the color conversion member CCM is improved.

The partition part BK may have a minimum width at a connected portion between the first sub-partition part BK-S1 and the second sub-partition part BK-S2. A portion having a minimum width $W_1$ corresponds to the recessed portion UC. The recessed portion UC may be formed during a development process in a process of manufacturing the partition part BK. The recessed portion UC may be a naturally curved portion formed during the development process. In this specification, the width represents a width on a cross-section. Thus, the width in the partition part BK corresponds to a maximum width in a direction parallel to the base layer BL.

The partition part BK may include the second sub-partition part BK-S2 disposed above the recessed portion UC and having a width that gradually increases in a direction toward the second surface SF-T and the first sub-partition part BK-S1 disposed below the recessed portion UC and having a width that gradually increases in a direction toward the first surface SF-B. The recessed portion UC may be a portion having a minimum width in the partition part BK.

When a maximum height in a thickness direction of the partition part BK is $H_{BK}$, and a maximum height in a thickness direction of the color control part CCP is $H_{CP}$, $H_{BK}$ and $H_{CP}$ satisfy the following inequation: $0.7*H_{BK} \leq H_{CP} \leq 1.3*H_{BK}$. That is, the height of the color control part CCP may be in a range of about 30% based on the height $H_{BK}$ of the partition part BK.

The height in the thickness direction of the partition part BK may be in a range from about 5 micrometers (μm) to about 20 μm. Preferably, the height in the thickness direction of the partition part BK may be in a range from about 10 μm to about 15 μm. In the partition part BK, the second sub-partition part BK-S2 adjacent to the liquid-repellent part BK-HP may have a height greater than that of the first sub-partition part BK-S1 adjacent to the base layer BL. The partition part BK having a shape in which the second sub-partition part BK-S2 has a height $H_{BK-2}$ that is two times or more of a height $H_{BK-1}$ of the first sub-partition part BK-S1 may be provided.

Particularly, in case of the partition part BK including the pigment or the dye PG, if the height in the thickness direction of the partition part BK is less than about 5 μm or greater than about 20 μm, an amount of light absorbed by the partition part BK may not be optimized, thereby degrading the color quality and optical efficiency of the color conversion member CCM.

A difference between the width $W_1$ of the recessed portion UC that is the connected portion between the first sub-partition part BK-S1 and the second sub-partition part BK-S2 and the maximum width $W_2$ of the second sub-partition part BK-S2 may be in a range from about 1.5 μm to about 3.5 μm. That is, the width $W_1$ of the recessed portion UC and the maximum width $W_2$ of the second sub-partition part BK-S2 may satisfy the following inequation: $1.5 \text{ μm} \leq W_2-W_1 \leq 3.5 \text{ μm}$. The partition part BK may have a recessed shape at the recessed portion UC, which is recessed as many as the range from about 1.5 μm to about 3.5 μm from the maximum width of the second sub-partition part BK-S2 that is an upper portion of the partition part BK.

A ratio between the difference between the width $W_1$ of the recessed portion UC that is the connected portion between the first sub-partition part BK-S1 and the second sub-partition part BK-S2 and the maximum width $W_2$ of the second sub-partition part BK-S2 and the maximum height $H_{BK}$ in the thickness direction of the partition part BK may be in a range from about 0.1 to about 0.48. That is, the width $W_1$ of the recessed portion UC, the maximum width $W_2$ of the second sub-partition part BK-S2 and the maximum height $H_{BK}$ in the thickness direction of the partition part BK may satisfy the following inequation: $0.1 \leq (W_2-W_1)/H_{BK} \leq 0.48$. A ratio of a recessed depth of the recessed portion UC to the maximum height in the thickness direction of the partition part BK may have a value equal to or greater than about 0.1 and less than about 0.48.

The first sub-partition part BK-S1 may have a maximum width $W_3$ equal to or greater than the maximum width $W_2$ of the second sub-partition part BK-S2.

The partition part BK according to an embodiment may include the recessed portion UC recessed to a central portion of the partition part BK by including the first sub-partition part BK-S1 having a width that gradually decreases in the thickness direction of the partition part BK and the second sub-partition part BK-S2 disposed on the first sub-partition part BK-S1 and having a width that gradually increases in the thickness direction of the partition part BK. The portion corresponding to the recessed portion UC may have a width less as many as the range from about 1.5 μm to about 3.5 μm than the maximum width of the second sub-partition part BK-S2 that is the upper portion of the partition part BK. Also, a length of the width of the portion corresponding to the recessed portion UC, which is less than the maximum width of the second sub-partition part BK-S2 that is the upper portion of the partition part BK, may have a ratio equal to or greater than 0.1 to less than 0.48 based on the total thickness of the partition part BK. As the partition part BK has the shape of the recessed portion UC according to the above-described condition, the color control part may not be lost in a process of forming the color control part between the partition parts, or the partition part patterns may not be lost in a cleaning process.

The third surface SF-S that is the side surface of the partition part BK may include a first side surface SF-S1 that is a side surface of the first sub-partition part BK-S1 and a second side surface SF-S2 that is a side surface of the second sub-partition part BK-S2. The second sub-partition part BK-S2 may have a width that gradually increases in a direction toward the second surface SF-T and have a taper angle greater than 90°. That is, an angle θ between the second side surface SF-S2 and the base layer BL may be greater than about 90°. In FIG. 4, the angle θ is an angle between the first surface SF-B and an extension line RFL of the second side surface SF-S2.

Referring to FIG. 3, the color conversion member CCM according to an embodiment may include the plurality of color control parts CCP-B, CCP-G, and CCP-R. The color control part CCP may include a first color control part CCP-B that transmits the first color light therethrough, a second color control part CCP-G including or containing a first quantum dot QD1 that converts the first color light into second color light, and a third color control part CCP-R including or containing a second quantum dot QD2 converting the first color light into third color light. The second color light may be light in a longer wavelength region than the first color light, and the third color light may be light in a longer wavelength region than each of the first color light and the second color light. In an embodiment, for example, the first color light may be blue light, the second color light may be green light, and the third color light may be red light. Also, the first color light may be provided from the display panel DP (refer to FIG. 2) to the color control part CCP.

The quantum dot QD1 and QD2 may be a particle for converting a wavelength of provided light. The quantum dot QD1 and QD2 may be selected from Group II-VI compound, Group III-V compound, Group IV-VI compound, Group IV element, Group IV compound, and a combination thereof.

The Group II-VI compound may be selected from a binary compound selected from CdSe, CdTe, ZnS, ZnSe, ZnTe, ZnO, HgS, HgSe, HgTe, MgSe, MgS, and a mixture thereof, a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The III-V compound may be selected from the group consisting of: a binary compound selected from GaN, GaP, GaAs, GaSb, AlN, AlP, AlAs, AlSb, InN, InP, InAs, InSb, and a mixture thereof a ternary compound selected from GaNP, GaNAs, GaNSb, GaPAs, GaPSb, AlNP, ANAs, AlNSb, AlPAs, AlPSb, InNP, InNAs, InNSb, InPAs, InPSb, GaAlNP, and a mixture thereof; and a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The IV-VI compound may be selected from the group consisting of: a binary compound selected from SnS, SnSe, SnTe, PbS, PbSe, PbTe, and a mixture thereof a ternary compound selected from SnSeS, SnSeTe, SnSTe, PbSeS, PbSeTe, PbSTe, SnPbS, SnPbSe, SnPbTe, and a mixture thereof and a quaternary compound selected from SnPbSSe, SnPbSeTe, SnPbSTe, and a mixture thereof. The Group IV element may be selected from Si, Ge, and a mixture thereof. The Group IV compound may be a binary compound selected from SiC, SiGe, and a mixture thereof.

Here, a binary compound, a ternary compound, and a quaternary compound may exist in a particle with a uniform concentration or exist in the same particle while being divided in a state in which a concentration distribution is partially different.

The quantum dots QD1 and QD2 may have a core-shell structure including a core and a shell surrounding the core. Alternatively, the quantum dot QD1 and QD2 may have a core-shell structure in which one quantum dot surrounds another quantum dot. An interface between the core and the shell may have a density gradient in which a density of an element existing in the shell gradually decreases in a direction toward a center thereof.

In some embodiments, the quantum dot QD1 and QD2 may have a core-shell structure including a core including a nano-crystal and a shell surrounding the core. The shell of the quantum dot QD1 and QD2 may serve as a protection layer for maintaining a semiconductor characteristic by preventing chemical denaturation of the core and/or as a charging layer for applying an electrophoretic characteristic to the quantum dot. The shell may be a single layer or multilayers. An interface between the core and the shell may have a density gradient in which a density of an element existing in the shell gradually decreases in a direction toward a center thereof. In an embodiment, for example, the shell of the quantum dot QD1 and QD2 may be a metal or non-metal oxide, a semiconductor compound, or a combination thereof.

In an embodiment, for example, the metal or non-metal oxide used in the shell may include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$ or a ternary compound such as $MgAl_2O_4$, $CoFe_2O_4$, $NiFe_2O_4$, and $CoMn_2O_4$. However, the embodiment of the invention is not limited thereto.

Also, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb. However, the embodiment of the invention is not limited thereto.

The quantum dot QD1 and QD2 may have a full width of half maximum ("FWHM") of a light emitting wavelength spectrum, which is equal to or less than about 45 nm, for example, equal to or less than about 40 nm, or equal to or less than about 30 nm, and, when the FWHM is in this range, color purity or color gamut may be improved. Also, since light emitted through the above-described quantum dot is emitted in all directions, a wide viewing angle may be improved.

Also, although the quantum dot QD1 and QD2 has a shape that is generally used in the field, the embodiment of the invention is not limited to the shape of the quantum dot. In more detail, the quantum dot may QD1 and QD2 may have a shape such as a globular shape, a pyramid shape, a multi-arm shape, or a shape of a nano-particle, a nano-tube, a nano-wire, a nano-fiber, or a nano-plate shaped particle of a cubic.

The quantum dot QD1 and QD2 may adjust a color of emitted light according to particle sizes, and thus the quantum dot QD1 and QD2 may have various emission colors such as blue, red, and green. As a particle size of the quantum dot QD1 and QD2 decreases, the quantum dot QD1 and QD2 may emit light in a short wavelength region. In an embodiment, for example, a particle size of the quantum dot that emits green light may be less than that of the quantum dot that emits red light.

In an embodiment, the first quantum dot QD1 may be a green quantum dot that emits green light, and the second quantum dot QD2 may be a red quantum dot that emits red light.

The color conversion layer CCL may further include a capping layer CPL. The capping layer CPL may be disposed on the color control part CCP and the partition part BK. The capping layer CPL may serve to prevent penetration of moisture and/or oxygen (hereinafter, referred to as 'moisture/oxygen'). The capping layer CPL may be disposed on the color control part CCP to block the color control part CCP from being exposed to the moisture/oxygen. The capping layer CPL may include at least one inorganic layer. That is, the capping layer CPL may include an inorganic material. In an embodiment, for example, the capping layer CPL may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride, or a metal thin-film having a light transmittance. Also, the capping layer CPL may further include an organic layer. The capping layer CPL may be formed of or defined by a single layer or a plurality of layers.

Referring to FIG. 3, the color conversion member CCM according to an embodiment may further include the color filter layer CFL, and the color filter layer CFL may be disposed between the base layer BL and the color control part CCP. The color filter layer CFL may include a light shielding part BM and a filter part CF.

The light shielding part BM may be disposed on the base layer BL. A plurality of light shielding parts BM may be spaced apart from each other to expose a portion of the base layer BL. Filters CF-B, CF-G, and CF-R may be disposed between the light shielding parts BM.

The filter part CF may include a plurality of filters CF-B, CF-G, and CF-R. That is, the color filter layer CFL may include a first filter CF-B that transmits the first color light therethrough, a second filter CF-G that transmits the second color light therethrough, and a third filter CF-R trans that transmits miffing the third color light therethrough. In an embodiment, for example, the first filter CF-B may be a blue filter, the second filter CF-G may be a green filter, and the third filter CF-R may be a red filter.

Each of the filters CF-B, CF-G, and CF-R may include a polymer photosensitive resin and a pigment or a dye. The first filter CF-B may include a blue pigment or dye, the second filter CF-G may include a green pigment or dye, and the third filter CF-R may include a red pigment or dye.

However, the embodiment of the invention is not limited thereto. In an embodiment, for example, the first filter CF-B may not include a pigment or a dye. The first filter CF-B may include a polymer photosensitive resin and may not include a pigment or a dye. The first filter CF-B may be transparent. The first filter CF-B may be made of a transparent photosensitive resin.

The light shielding part BM may be a black matrix. The light shielding part BM may include an organic light shielding material or an inorganic light shielding material, which includes or contains a black pigment or a black dye. The light shielding part BM may prevent a light leakage phenomenon and distinguish a boundary between the adjacent color filters CF-B, CF-G, and CF-R.

The plurality of light shielding parts BM may be spaced apart from each other and respectively overlap the plurality of partition parts BK.

The color filter layer CFL may further include a low refractive layer LRL. The low refractive layer LRL may be disposed between the filter part CF and the color conversion layer CCL. The low refractive layer LRL may have a refractive index of about 1.1 or more and about 1.5 or less. The refractive index of the low refractive layer LRL may be adjusted by a ratio of hollow inorganic particles and/or voids contained in the low refractive layer LRL.

The color filter layer CFL may further include a buffer layer BFL. Although the buffer layer BFL is disposed between the filter part CF and the low refractive layer LRL in FIG. 3, the embodiment of the invention is not limited thereto. In an embodiment, for example, the buffer layer BFL may be disposed adjacent to the color conversion layer CCL on the low refractive layer LRL. The buffer layer BFL may be a protection layer protecting the low refractive layer LRL or the filter part CF. The buffer layer BFL may be an inorganic layer including or containing at least one inorganic material of a silicon nitride, a silicon oxide, and a silicon oxynitride. The buffer layer BFL may include a single layer or a plurality of layers.

Figure 6:
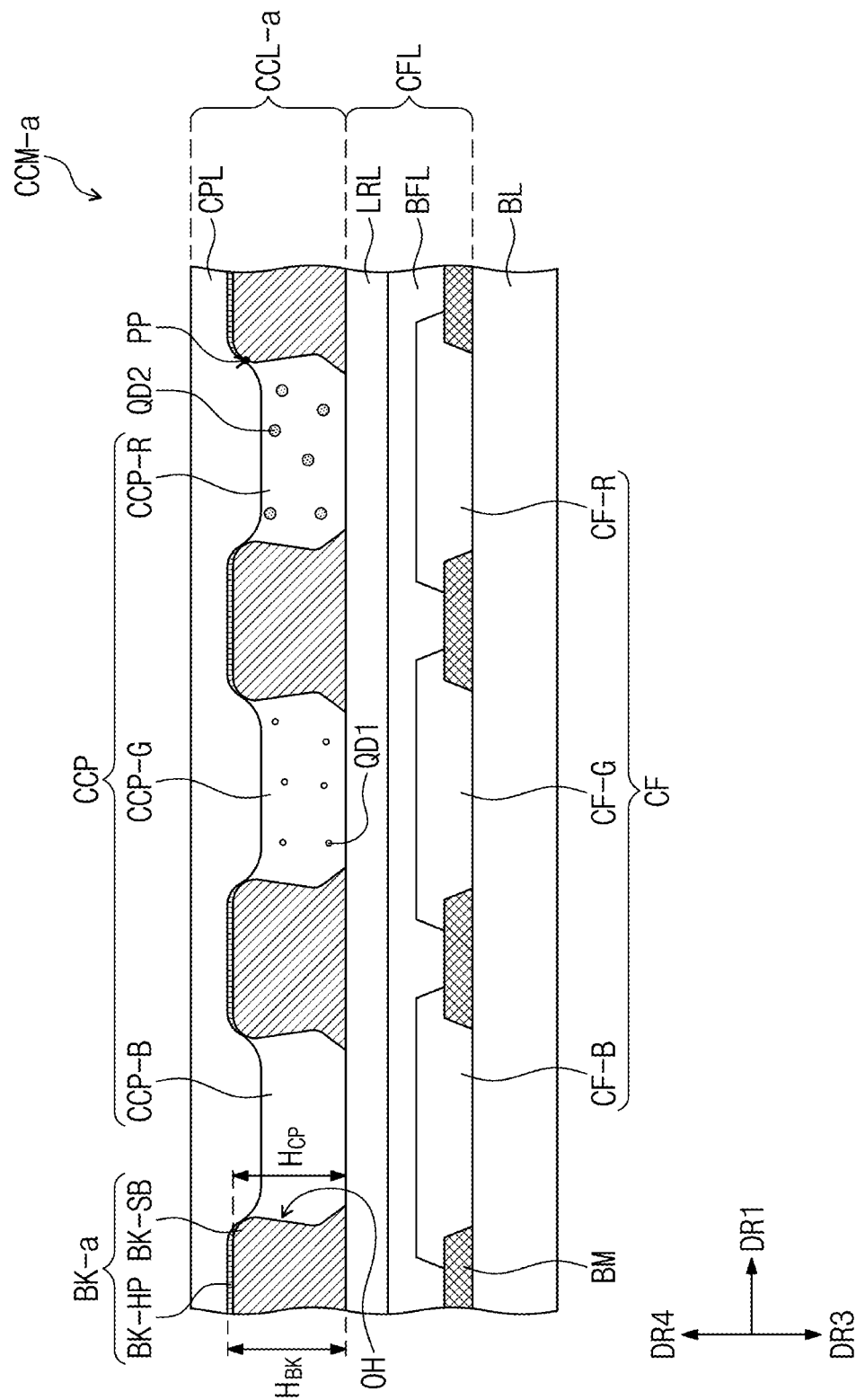
FIG. 6 is a cross-sectional view illustrating a portion of a color conversion member according to an embodiment.
Figure 7:
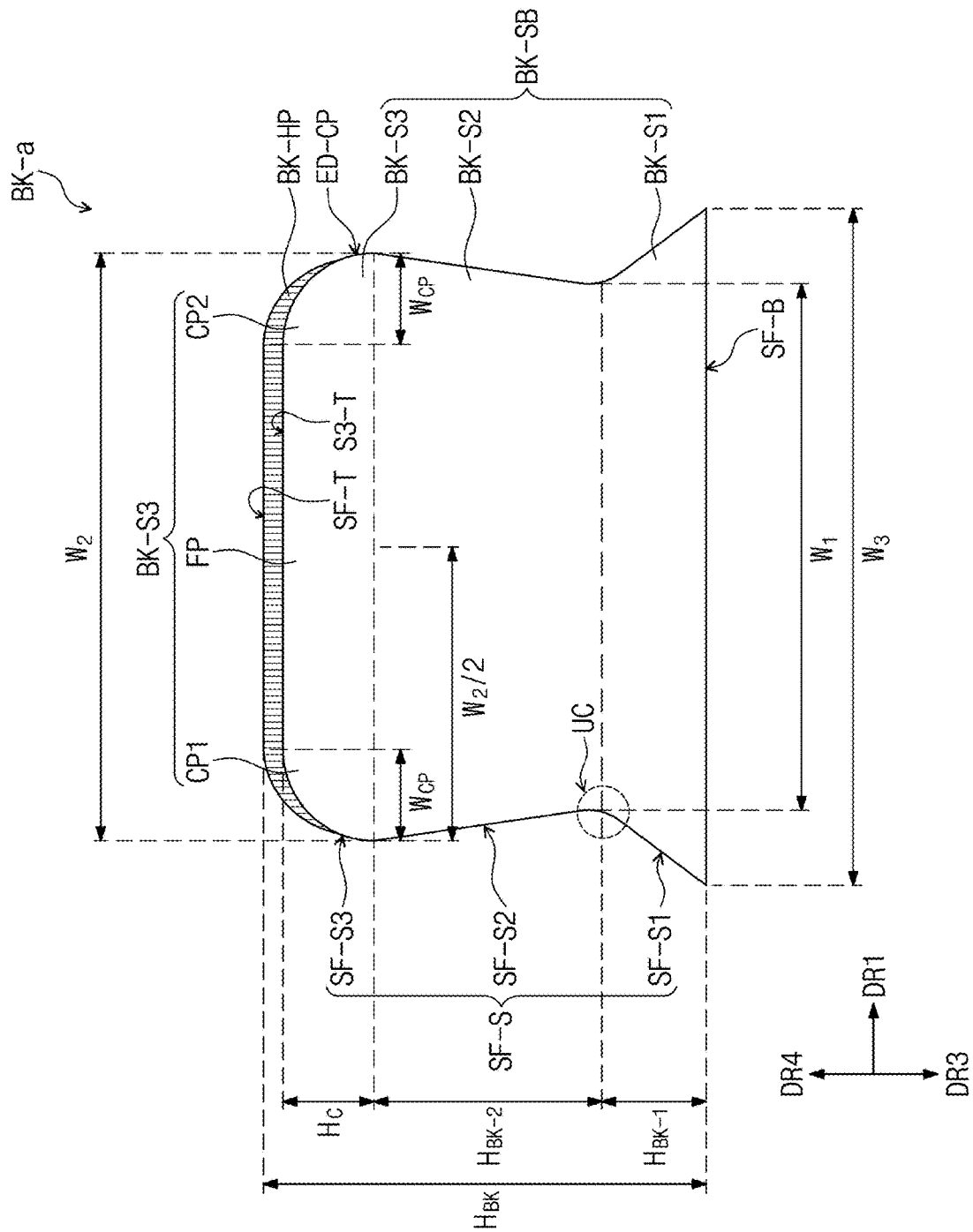
FIG. 7 is a cross-sectional view of a partition part according to an embodiment.
Figure 8:
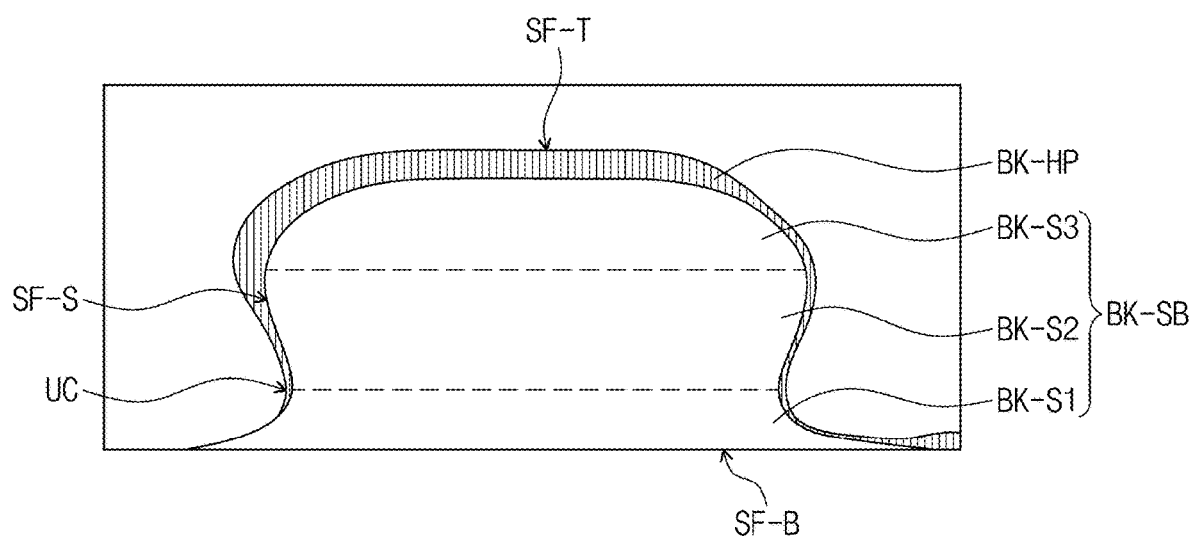
FIG. 8 is an image showing the partition part according to an embodiment.

FIG. 6 is a cross-sectional view illustrating a portion of a color conversion member CCM-a according to an embodiment. FIG. 7 is a cross-sectional view illustrating a partition part BK-a according to an embodiment, and FIG. 8 is a photograph showing a scanning electron microscope image of the partition part BK-a according to an embodiment. Each of the cross-sectional views of FIGS. 6 and 7 is parallel to the surface defined by the first directional axis DR1 and the fourth directional axis DR4.

FIG. 6 illustrates an embodiment where the color conversion member CCM-a includes the partition part BK-a having a different shape from that of the color conversion layer CCL in FIG. 3. Hereinafter, when FIGS. 6 to 8 are described, the same elements or features as those previously described in FIGS. 3 to 5 will not be described again, and different elements or features will be mainly described.

Referring to FIG. 6, an embodiment of the color conversion member CCM-a includes a base layer BL and a color conversion layer CCL-a disposed on the base layer BL. Also, the color conversion member CCM-a further includes a color filter layer CFL disposed between the base layer BL and the color conversion layer CCL-a. The color conversion layer CCL-a includes a plurality of partition parts BK-a and a color control part CCP disposed between the partition parts BK-a.

In an embodiment of the color conversion member CCM-a in FIG. 6, features of the base layer BL, the color filter layer CFL, and the color control part CCP may be the same as those described in FIGS. 3 to 5.

Referring to FIGS. 6 to 8, the partition part BK-a according to an embodiment may include a base partition part BK-SB adjacent to the base layer BL and a liquid-repellent part BK-HP disposed on the base partition part BK-SB. The base partition part BK-SB of the partition part BK-a according to an embodiment may include a first sub-partition part BK-S1 having a width that gradually decreases in a direction from a first surface SF-B adjacent to the base layer BL to a second surface SF-T facing the first surface SF-B, a second sub-partition part BK-S2 having a width that gradually increases in a direction from the first sub-partition part BK-S1 to the second surface SF-T, and a third sub-partition part BK-S3 having a width that gradually decreases in a direction from the second sub-partition part BK-S2 to the liquid-repellent part BK-HP. Also, the partition part BK-a may include the liquid-repellent part BK-HP disposed on the third sub-partition part BK-S3 and including a liquid-repellent additive. The third surface SF-S that is the side surface of the partition part BK may include a first side surface SF-S1 that is a side surface of the first sub-partition part BK-S1, a second side surface SF-S2 that is a side surface of the second sub-partition part BK-S2, and a third side surface SF-S3 that is a side surface of the second sub-partition part BK-S3.

An edge of a top surface S3-T of the third sub-partition part BK-S3 may have a curved shape. On a cross-section perpendicular to the base layer BL, the third sub-partition part BK-S3 may include a flat portion FP having a substantially flat top surface and curved portions CP1 and CP2 respectively disposed on side surfaces of the flat portion FP. Each of the curved portions CP1 and CP2 may have a curved shape having a width that gradually decreases in the direction from the second sub-partition part BK-S2 to the liquid-repellent part BK-HP.

The partition part BK-a may include a first curved portion CP1 and a second curved portion CP2. The first curved portion CP1 may be disposed at one side of the flat portion FP, and the second curved portion CP2 may be disposed at the other side of the flat portion FP, which is symmetric to the first curved portion CP1 based on the flat portion FP.

When the second sub-partition part BK-S2 has a maximum width of $W_2$, and a maximum height from the second sub-partition part BK-S2 to the top surface S3-T of the third sub-partition part BK-S3 is $H_C$, $W_2$ and $H_C$ may satisfy the following inequation 1.

$$0 \leq H_C/(W_2/2) \leq 0.5 \quad \text{[Inequation 1]}$$

A case in which "$H_C/(W_2/2)$" is 0 in the relationship of the equation 1 may correspond to the partition part BK excluding the third sub-partition part BK-S3 according to an embodiment in FIG. 4. Thus, the "$H_C/(W_2/2)$" of the partition part BK-a may have a value of 0 or more.

Also, when the "$H_C/(W_2/2)$" is greater than 0.5, a height of the third sub-partition part BK-S3 including the curved portions CP1 and CP2 may relatively increase. Thus, as the height of the curved portion of the partition part BK-a increases, flatness of the color conversion layer CCL may decrease. That is, when the "$H_C/(W_2/2)$" is greater than 0.5, as the surface flatness of the color conversion layer CCL decreases, an amount of light scattered at the partition part BK-a of the color conversion layer CCL may increases, thereby degrading a display quality of the display device ES (refer to FIG. 1).

On a cross-section defined by the first directional axis DR1 and the fourth directional axis DR4, when the second sub-partition part BK-S2 has the maximum width of $W_2$, and the curved portion CP1 and CP2 has a maximum width of $W_{CP}$, $W_2$ and $W_{CP}$ may satisfy the following inequation: $W_{CP} \leq 0.4*W_2$. That is, when the partition part BK-a according to an embodiment includes the third sub-partition part BK-S3, the third sub-partition part BK-S3 may include at least a portion of the flat portion FP.

An edge PP of the top surface of the color control part CCP may overlap the curved portion CP1 and CP2. The edge PP of the top surface of the color control part CCP may be a pinning point which is disposed on the curved portion CP1 and CP2 and at which the color control part CCP and the liquid-repellent part BK-HP contact each other. The edge PP of the top surface of the color control part CCP may be disposed within a range of $0.23*W_2$ in a direction to the flat portion FP from an edge ED-CP of the curved part CP1 and CP2 of the third sub-partition part BK-S3.

When a maximum height in a thickness direction of the partition part BK-a is $H_{BK}$, and a maximum height in a thickness direction of the color control part CCP is $H_{CP}$, $H_{BK}$ and $H_{CP}$ may satisfy the following inequation: $0.7*H_{BK} \leq H_{CP} \leq 1.3*H_{BK}$. That is, the height of the color control part CCP may be in a range of about 20% of the height $H_{BK}$ of the partition part BK. The height $H_{BK}$ of the partition part BK may represent a total height of all of the first to third sub-partition parts BK-S1, BK-S2, and BK-S3 and the liquid-repellent part BK-HP.

The height $H_C$ in the thickness direction of the third sub-partition part BK-S3 may be about 30% or less of the height $H_{BK}$ in the thickness direction of the partition part BK-a. If the height $H_C$ of the third sub-partition part BK-S3 is greater than about 30% of the height $H_{BK}$ of the partition part BK-a, the surface flatness of the color conversion layer CCL may decrease, and the amount of light scattered at the partition part BK-a of the color conversion layer CCL may increase, thereby degrading the display quality of the display device ES (refer to FIG. 1).

The partition part BK-a according to an embodiment may have a minimum width at a connected portion between the first sub-partition part BK-S1 and the second sub-partition part BK-S2 as in the partition part BK in FIG. 4. A portion having a minimum width $W_1$ corresponds to a recessed portion UC. In such an embodiment, the recessed portion UC may be the same as that described in FIG. 4 and any repetitive detailed description thereof will be omitted.

The partition part BK may include the second sub-partition part BK-S2 disposed above the recessed portion UC and having a width that gradually increases in a direction toward the second surface SF-T and the first sub-partition part BK-S1 disposed below the recessed portion UC and having a width that gradually increases in a direction toward the first surface SF-B. The recessed portion UC may be a portion having a minimum width in the partition part BK.

A difference between the width $W_1$ of the recessed portion UC that is the connected portion between the first sub-partition part BK-S1 and the second sub-partition part BK-S2 and the width $W_2$ of a connected portion between the second sub-partition part BK-S2 and the third sub-partition part BK-S3 may be in a range from about 1.5 μm to about 3.5 μm. That is, the width $W_1$ of the recessed portion UC and the width $W_2$ of the connected portion between the second sub-partition part BK-S2 and the third sub-partition part BK-S3 may satisfy the following inequation: $1.5 \text{ μm} \leq W_2 - W_1 \leq 3.5 \text{ μm}$. The partition part BK may have a recessed shape at the recessed portion UC, which is recessed as many as the range from about 1.5 μm to about 3.5 μm from the width of the connected portion between the second sub-partition part BK-S2 and the third sub-partition part BK-S3 that are an upper portion of the partition part BK-a.

A ratio between the maximum height $H_{BK}$ in the thickness direction of the partition part BK and the difference between the width $W_1$ of the recessed portion UC that is the connected portion between the first sub-partition part BK-S1 and the second sub-partition part BK-S2 and the width $W_2$ of the connected portion between the second sub-partition part BK-S2 and the third sub-partition part BK-S3 may be equal to or greater than about 0.1 and less than about 0.48. That is, the maximum height $H_{BK}$ in the thickness direction of the partition part BK, the width $W_1$ of the recessed portion UC and the width $W_2$ of the connected portion between the second sub-partition part BK-S2 and the third sub-partition part BK-S3 may satisfy the following inequation: $0.1 \leq (W_2 - W_1)/H_{BK} \leq 0.48$. A ratio of a recessed depth of the recessed portion UC to the maximum height in the thickness direction of the partition part BK may have a value equal to or greater than about 0.1 and less than about 0.48.

The partition part BK-a according to an embodiment may include the recessed portion UC recessed to a central portion of the partition part BK-a even when the partition part BK-a further includes the third sub-partition part BK-S3 having the curved shape at the edge of the top surface S3-T in addition to a case of including the first sub-partition part BK-S1 having a width that gradually decreases in the thickness direction of the partition part BK-a and the second sub-partition part BK-S2 disposed on the first sub-partition part BK-S1 and having a width that gradually increases in the thickness direction of the partition part BK-a and even when the partition part BK-a further includes the third sub-partition part BK-S3 having the curved shape at the edge of the top surface S3-T. The portion corresponding to the recessed portion UC may have a width less as many as the range from about 1.5 µm to about 3.5 µm than that of the connected portion between the second sub-partition part BK-S2 and the third sub-partition part BK-S3. Also, a length of the width of the portion corresponding to the recessed portion UC, which is less than the width of the connected portion between the second sub-partition part BK-S2 and the third sub-partition part BK-S3 that are the upper portion of the partition part BK-a, may have a ratio equal to or greater than about 0.1 to less than 0.48 based on the total thickness of the partition part BK-a. As the partition part BK-a has the shape of the recessed portion UC according to the above-described condition, the color control part may not be lost in a process of forming the color control part between the partition parts, or the partition part patterns may not be lost in a cleaning process.

Figure 9:
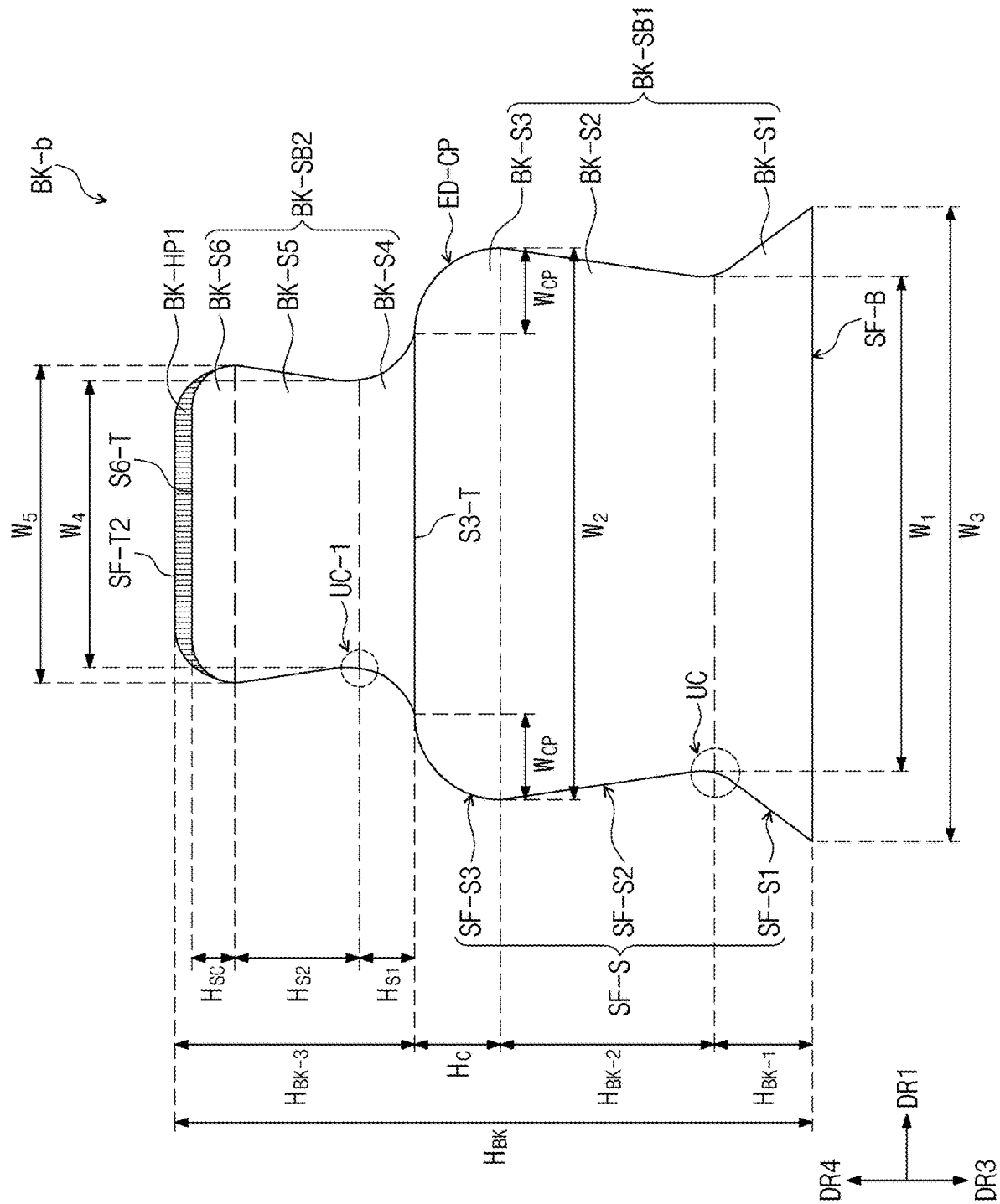
FIG. 9 is a cross-sectional view illustrating a partition part according to an embodiment.

FIG. 9 is a cross-sectional view illustrating a partition part BK-b according to an embodiment. Hereinafter, when FIG. 9 is described, the same or like elements as those previously described in FIGS. 3 to 8 will not be described again, and different elements or features will be mainly described.

Referring to FIG. 9, the partition part BK-b according to an embodiment may include a plurality of base partition parts BK-SB1 and BK-SB2 that are sequentially laminated or disposed one on another. The partition part BK-b may have a structure in which a second base partition part BK-SB2 is disposed on a first base partition part BK-SB1. The first base partition part BK-SB1 may be substantially the same component as the base partition part BK-SB of the partition part BK-a described in FIGS. 6 to 8, and the second base partition part BK-SB2 may be an additional partition structure disposed on the first base partition part BK-SB1.

The second base partition part BK-SB2 may have a cross-sectional shape in a "similarity" relationship with the first base partition part BK-SB1. In this specification, the "similarity" may represent that two components having different sizes substantially have the same shape as each other. That is, the second base partition part BK-SB2 may have a cross-sectional shape that is substantially the same as that of the first base partition part BK-SB1 with different sizes.

The second base partition part BK-SB2 may include a fourth sub-partition part BK-S4 having a height $H_{S1}$ and a width that gradually decreases in a direction from a top surface S3-T of a third sub-partition part BK-S3 to a top surface SF-T2 of the second base partition part BK-SB2, a fifth sub-partition part BK-S5 having a height $H_{S2}$ and a width that gradually increases in a direction from the fourth sub-partition part BK-S4 to the top surface SF-T2 of the second base partition part BK-SB2, and a sixth sub-partition part BK-S6 having a width that gradually decreases in a direction from the fifth sub-partition part BK-S5 to a second liquid-repellent part BK-HP1. Also, the second base partition part BK-SB2 may include the second liquid-repellent part BK-HP1 disposed on the sixth sub-partition part BK-S6 and including a liquid-repellent additive.

When the fifth sub-partition part BK-S5 has a maximum width of $W_5$, and a maximum height from the fifth sub-partition part BK-S5 to the sixth sub-partition part BK-S6 (or the top surface S6-T there) is $H_{SC}$, $W_5$ and $H_{SC}$ may satisfy the following inequation 2.

$$0 \leq H_{SC}/(W_5/2) \leq 0.5 \quad \text{[Inequation 2]}$$

A case in which "$H_{SC}/(W_5/2)$" is 0 in the relationship of the equation 2 may correspond to the partition part excluding the sixth sub-partition part BK-S6 according to an embodiment. Thus, the "$H_{SC}/(W_5/2)$" of the partition part BK-b may have a value of 0 or more.

Also, if the "$H_C/(W_2/2)$" is greater than about 0.5, a height of the third sub-partition part BK-S3 including curved portions CP1 and CP2 may relatively increase. Thus, as the height of the curved portion of the partition part BK-a increases, flatness of a color conversion layer CCL may decrease. That is, when the "$H_C/(W_2/2)$" is greater than about 0.5, as the surface flatness of the color conversion layer CCL decreases, an amount of light scattered at the partition part BK-a of the color conversion layer CCL may increases, thereby degrading the display quality of the display device ES (refer to FIG. 1).

A height $H_{SC}$ in a thickness direction of the sixth sub-partition part BK-S6 may be about 30% or less of a height $H_{BK-3}$ in the thickness direction of the second base partition part BK-SB2. When the height $H_{SC}$ of the sixth sub-partition part BK-S6 is greater than 30% of the height $H_{BK-3}$ of the second base partition part BK-SB2, the surface flatness of the color conversion layer may decrease, and the amount of light scattered at the partition part BK-b of the color conversion layer may increase, thereby degrading the display quality of the display device ES (refer to FIG. 1).

The height in the thickness direction of the second base partition part BK-SB2 may be in a range from about 4 µm to about 10 µm. In an embodiment, for example, the height in the thickness direction of the second base partition part BK-SB2 may be in a range from about 5 µm to about 8 µm. In the second base partition part BK-SB2, a height of the fifth sub-partition part BK-S5 adjacent to the second liquid-repellent part BK-HP1 may be greater than that of the fourth sub-partition part BK-S4 adjacent to the first base partition part BK-1. The second base partition part BK-SB2 may have a height less than that of the first base partition part BK-SB1. In an embodiment, the first base partition part BK-SB1 may have a height of about 10 µm or more and about 15 µm or less, and the second base partition part BK-SB2 may have a height of about 5 µm or more and about 8 µm or less.

The second base partition part BK-SB2 may have a minimum width at a connected portion between the fourth sub-partition part BK-S4 and the fifth sub-partition part BK-S5. A portion having a minimum width $W_4$ corresponds to a recessed portion UC-1. The recessed portion UC-1 may be provided during a development process in a process of manufacturing the second base partition part BK-SB2.

A difference between the width $W_4$ of the recessed portion UC-1 that is the connected portion between the fourth sub-partition part BK-S4 and the fifth sub-partition part BK-S5 and the maximum width $W_5$ of the fifth sub-partition part BK-S5 may be in a range from about 0.6 μm to about 2.1 μm. That is, the width $W_4$ of the recessed portion UC-1 and the maximum width $W_5$ of the fifth sub-partition part BK-S5 may satisfy the following inequation: 0.6 μm≤$W_5$−$W_4$≤2.1 μm. The second base partition part BK-SB2 may have a recessed shape at the recessed portion UC-1, which is recessed by about 0.6 μm to about 2.1 μm from the maximum width of the fifth sub-partition part BK-S5 that is an upper portion of the second base partition part BK-SB2.

A ratio between the height $H_{BK-3}$ in the thickness direction of the second base partition part BK-SB2 and the difference between the width $W_4$ of the recessed portion UC-1 that is the connected portion between the fourth sub-partition part BK-S4 and the fifth sub-partition part BK-S5 and the maximum width $W_5$ of the fifth sub-partition part BK-S5 may be equal to or greater than about 0.1 and less than about 0.48. That is, the height $H_{BK-3}$ in the thickness direction of the second base partition part BK-SB2, the width $W_4$ of the recessed portion UC-1 and the maximum width $W_5$ of the fifth sub-partition part BK-S5 may satisfy the following inequation: 0.1≤($W_5$−$W_4$)/$H_{BK-3}$≤0.48. A ratio of a recessed depth of the recessed portion UC-1 to the height $H_{BK-3}$ in the thickness direction of the second base partition part BK-SB2 may have a value equal to or greater than about 0.1 and less than about 0.48.

The partition part BK-b according to an embodiment may have a shape in which the first base partition part BK-SB1 and the second base partition part BK-SB2 having the similarity relationship with the first base partition part BK-SB1 are laminated or disposed one on another, and each of the first base partition part BK-SB1 and the second base partition part BK-SB2 may have a shape having the recessed portion UC and UC-1. As the partition part BK-b includes a plurality of partition parts BK-SB1 and BK-SB2, the partition part BK-b may have a great height without a defect such as loss of a partition part pattern. Also, as each of the first base partition part BK-SB1 and the second base partition part BK-SB2 includes the recessed portion UC and UC-1, and the recessed portion UC and UC-1 has a shape according to the above-described condition, the partition part patterns may not be lost in a process of forming the first base partition part BK-SB1 and the second base partition part BK-SB2 through a continuous process, and a color control part pattern may not be lost in a process of forming the color control part between the partition parts.

Hereinafter, the partition part according to an embodiment of the invention will be described in more detail through a specific embodiment and a comparative example. The following embodiment is merely illustrative for understanding of the invention, and the invention is not limited thereto.

Table 1 below shows a thickness and a width of a partition part contained in a color conversion member according to embodiments 1 to 7 and comparative examples 1 to 5. In the table 1, "maximum width" represents the maximum width $W_2$ of the second sub-partition part BK-S2 in FIG. 4. In the table 1, "minimum width" represents the width $W_1$ of the recessed portion UC that is the connected portion between the first sub-partition part BK-S1 and the second sub-partition part BK-S2 in FIG. 4. In the color conversion member of the embodiments 1 to 7 and the comparative examples 1 to 5 below, surface energy of the partition part is about 21 dyn/cm, and surface energy of the color control part is about 31 dyn/cm.

TABLE 1

| Color conversion member | Maximum width $W_2$ (μm) | Minimum width $W_1$ (μm) | Thickness $H_{BK}$ (μm) | Whether color control part is lost |
|---|---|---|---|---|
| Embodiment 1 | 25 | 23 | 11 | X |
| Embodiment 2 | 25 | 22 | 11 | X |
| Embodiment 3 | 25 | 21 | 11 | X |
| Embodiment 4 | 15 | 13.5 | 7 | X |
| Embodiment 5 | 15 | 13 | 7 | X |
| Embodiment 6 | 15 | 13.5 | 8 | X |
| Embodiment 7 | 15 | 13.5 | 9 | X |
| Comparative example 1 | 25 | 25 | 11 | ○ |
| Comparative example 2 | 25 | 24 | 11 | ○ |
| Comparative example 3 | 15 | 15 | 7 | ○ |
| Comparative example 4 | 15 | 14.5 | 7 | ○ |
| Comparative example 5 | 15 | 14 | 7 | ○ |

Referring to results of the table 1, reliability of the color conversion member of the embodiments may be improved by preventing the color control part disposed between the partition parts from being lost in comparison with that of the comparative examples. Specifically, since the color conversion member of the embodiments 1 to 7 has a difference of about 1.5 μm or more between the maximum width and the minimum width of the partition part, the color control part disposed between the partition parts may not be lost.

Figure 10:
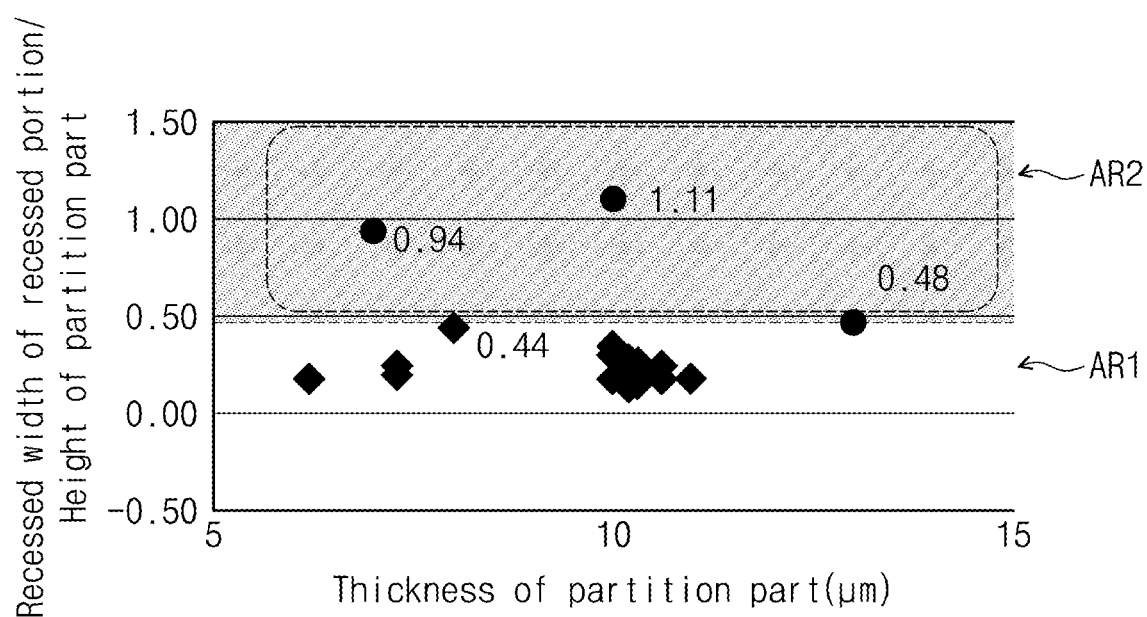
FIG. 10 is a graph representing a ratio of a recessed width of a recessed portion to a height of the partition part in the color conversion member according to an embodiment.

FIG. 10 is a graph representing a ratio of the recessed width of the recessed portion to the height of the partition part in the color conversion member according to an embodiment. FIG. 10 indicates values of each of the embodiments and the comparative examples by using the height of the partition part as a X-axis and the ratio of the recessed width of the recessed portion to the height of the partition part as a Y-axis in the partition part in the color conversion member. In an area having a X-axis range from about 10 μm to about 15 μm, the height of the partition part represents the total height $H_{BK}$ of the partition part in FIG. 7, and the recessed width of the recessed portion represents a difference between the $W_2$ and the $W_1$. In an area having a X-axis range from about 10 μm to about 15 μm, the height of the partition part represents the height $H_{BK-3}$ of the second base partition part in FIG. 9, and the recessed width of the recessed portion represents a difference between the $W_5$ and the $W_4$.

It may be shown that the partition part pattern is lost when the partition part has a value of the recessed width of the recessed portion to the height of the partition part in a comparative example area AR2 having a Y-axis value of 0.48 or more in FIG. 10 in a process of forming the partition part pattern according to an embodiment. It may be checked that the normal partition part pattern is provided instead of losing the partition part pattern when the partition part has a value of the recessed width of the recessed portion to the height of the partition part in an embodiment area AR1 having a Y-axis value less than 0.48 FIG. 10. Through this, as the partition part according to an embodiment of the invention has a ratio of the recessed width of the recessed portion to the height of the partition part less than 0.48, the color conversion member having high reliability may be provided.

FIGS. 11A to 11E are schematic views illustrating processes of a method for manufacturing a color conversion member according to an embodiment.

Figure 11A:
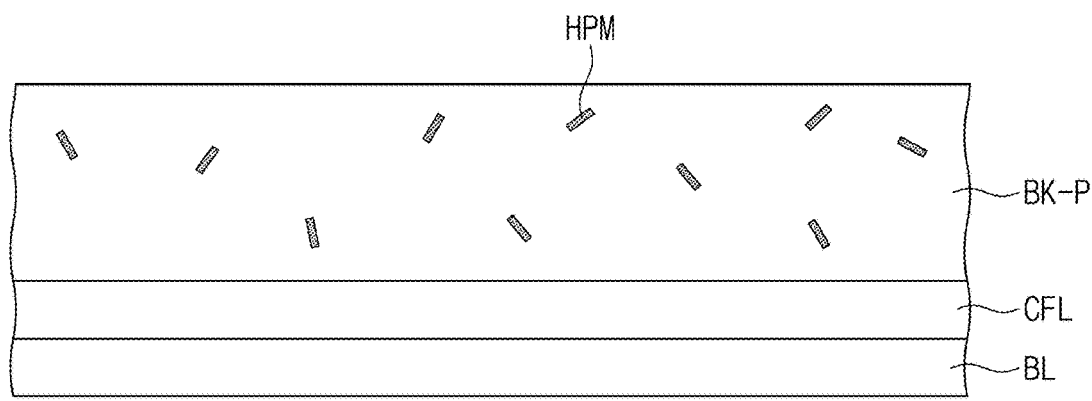
FIGS. 11A to 11E are schematic views illustrating processes of a method for manufacturing a color conversion member according to an embodiment.

FIG. 11A illustrates a process of providing a resin composition BK-P for forming a partition part BK-a on a base layer BL. The resin composition BK-P may be provided on a color filter layer CFL disposed on the base layer BL. The resin composition BK-P may include a liquid-repellent additive HPM. The liquid-repellent additive HPM may be distributed in the resin composition BK-P.

Figure 11B:
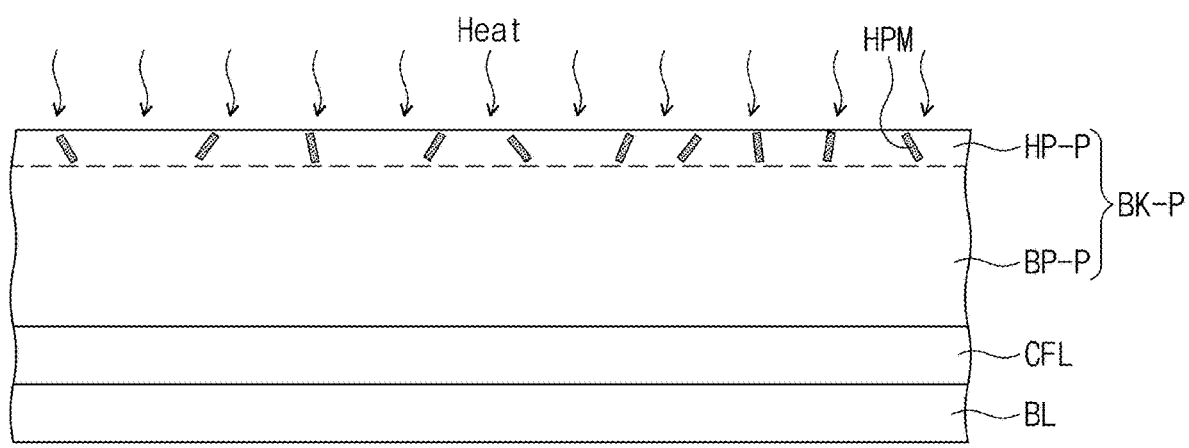

FIG. 11B illustrates a process of baking the resin composition BK-P. In the baking process, the resin composition BK-P may be phase-separated into a preliminary liquid-repellent part HP-P including most of the liquid-repellent additive HPM and a preliminary sub-partition part BP-P including only an extremely small amount of the liquid-repellent additive HPM or excluding the liquid-repellent additive HPM. The baking process may be performed at a temperature of 80° C. to 120° C. within five minutes.

Figure 11C:
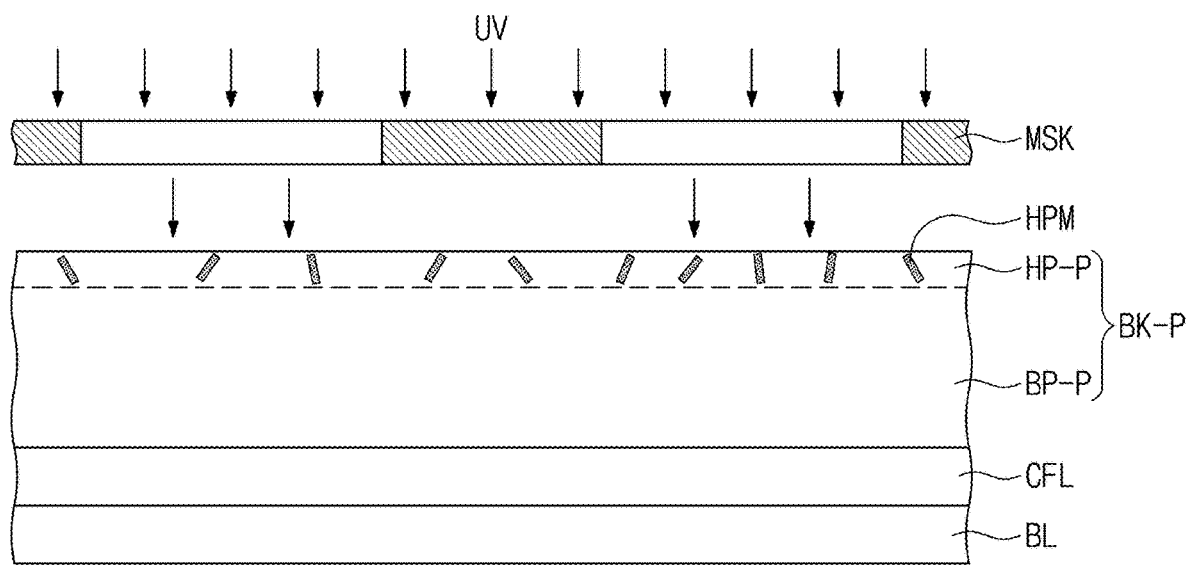

FIG. 11C illustrates a process of curing the resin composition BK-P. The resin composition BK-P may be cured by using ultraviolet light UV. The ultraviolet light UV may be provided by using a projection type exposure device. As the ultraviolet light UV transmitted through a mask MSK is provided to the resin composition BK-P, the resin composition BK-P may be cured along a pattern of the mask MSK to form a shape of a patterned partition part BK-a. In the curing process, the preliminary liquid-repellent part HP-P and the preliminary sub-partition part BP-P may be cured and fixed in a phase separated state.

Figure 11D:
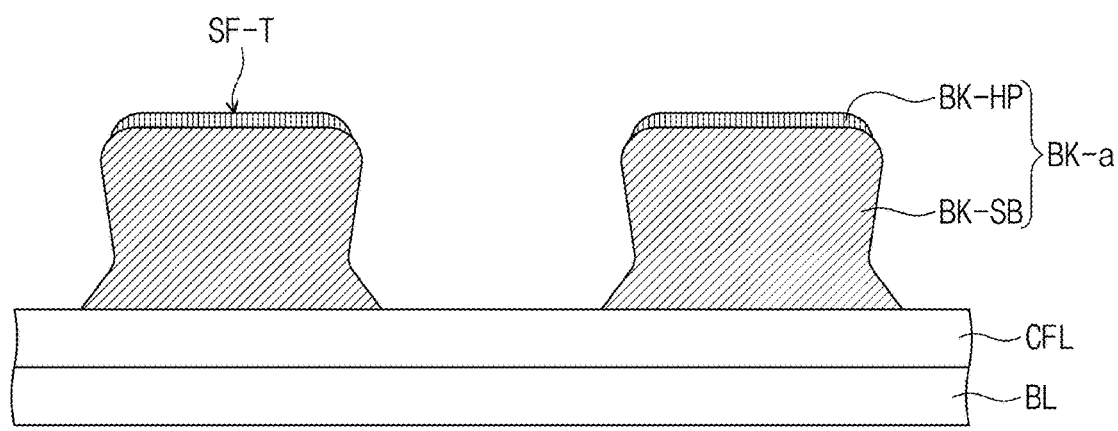

Thus, the liquid-repellent part BK-HP including or containing the liquid-repellent additive HPM may provide a second surface SF-T that is a top surface of the partition part BK. FIG. 11D illustrates a process of forming a pattern of the partition part BK-a by providing a developer after the curing process of FIG. 11C. The partition part BK-a may include the liquid-repellent part BK-HP having relatively low surface energy and a base partition part BK-SB having relatively higher surface energy than the liquid-repellent part BK-HP. The liquid-repellent part BK-HP may be exposed through the second surface SF-T that is the top surface of the partition part BK-a.

Figure 11E:
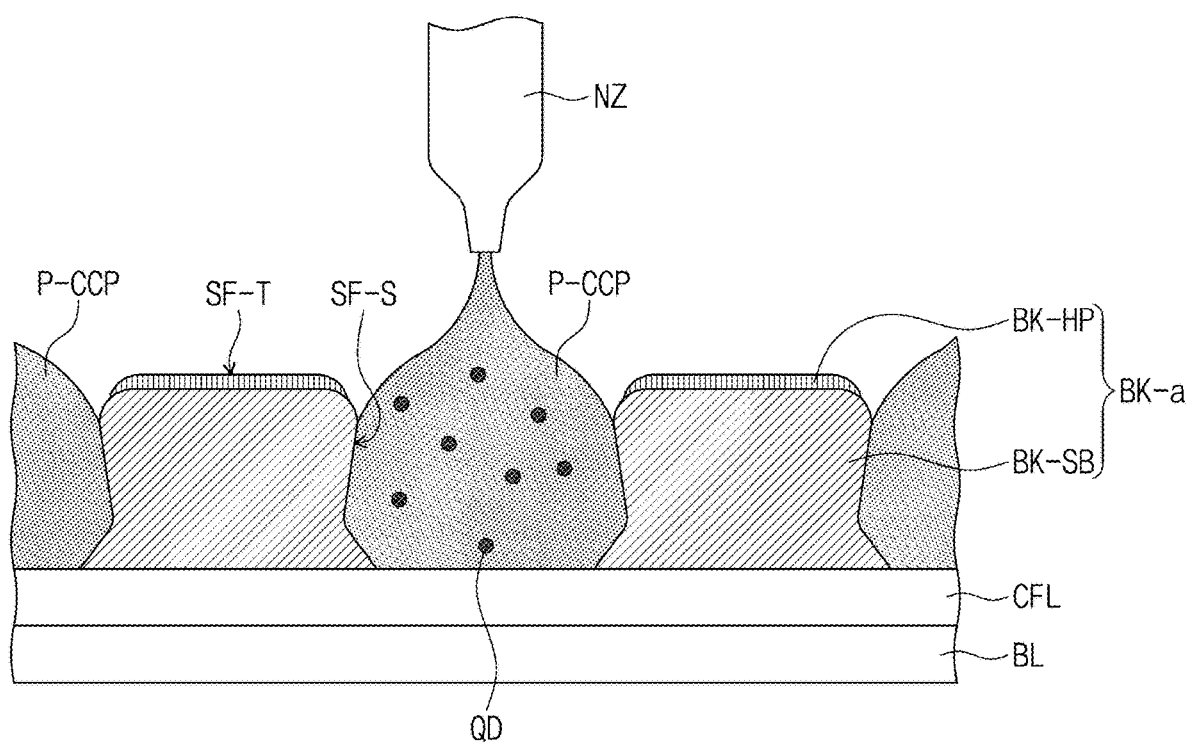

FIG. 11E illustrates a process of providing a color control part resin P-CCP between the partition parts BK-a. The color control part resin P-CCP may be provided between the partition parts BK-a and disposed only in a space between the partition parts BK-a instead of being spread onto the liquid-repellent part BK-HP. That is, since surface energy of the liquid-repellent part BK-HP of the partition part BK-a is less than that of the color control part resin P-CCP, the color control part resin P-CCP may be disposed only in the space between the partition parts BK-a instead of being spread onto the liquid-repellent part BK-HP or mixed with the neighbored color control part resin P-CCP.

Also, since surface energy of the base partition part BK-SB is greater than that of the color control part resin P-CCP, the color control part resin P-CCP may have a satisfactory adhesion force and be wetted to a side surface of the base partition part BK-SB.

The color control part resin P-CCP may include or contain a quantum dot QD and be provided through a nozzle NZ. In an embodiment, for example, the process of providing the color control part resin P-CCP may provide the color control part resin P-CCP by an inkjet printing method.

The above-described configuration of the color conversion member CCM and CCM-a according to an embodiment described with reference to FIGS. 3 to 11e is not limited to the drawings. In an embodiment, for example, the shape of the partition part BK and BK-a may be deformed while the partition part BK and BK-a includes the base partition part BK-SB and the liquid-repellent part BK-HP, and the base partition part BK-SB has the above-described characteristics of the shape of the first to third sub-partition parts BK-S1, BK-S2, and BK-S3.

The color conversion member according to an embodiment may improve a patterning quality and a coatability of the color control part to have high color quality and improved durability by including the partition part including the liquid-repellent part having liquid repellency on the top surface thereof and the base partition part having the relatively high surface energy below the liquid-repellent part.

Figure 12:
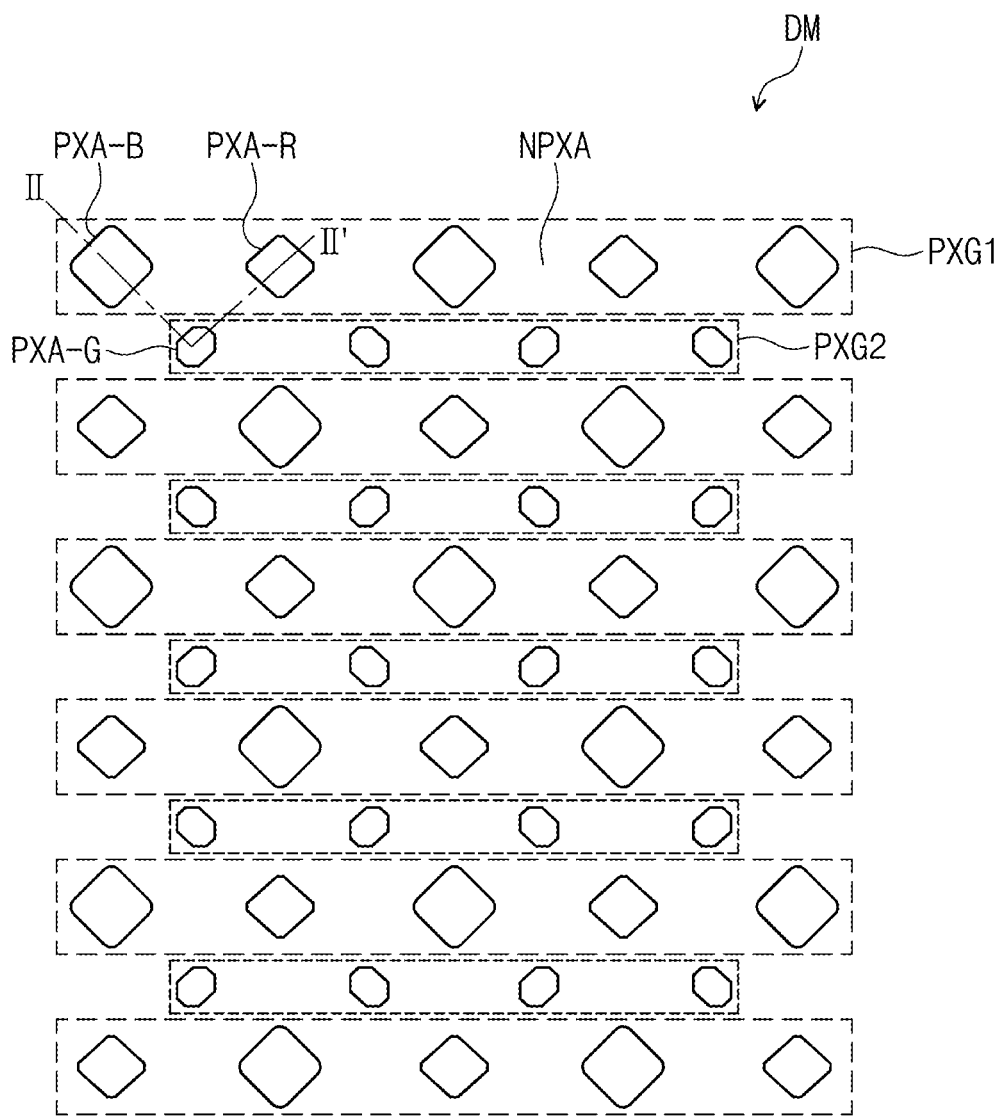
FIG. 12 is a plan view illustrating a display module according to an embodiment.
Figure 13:
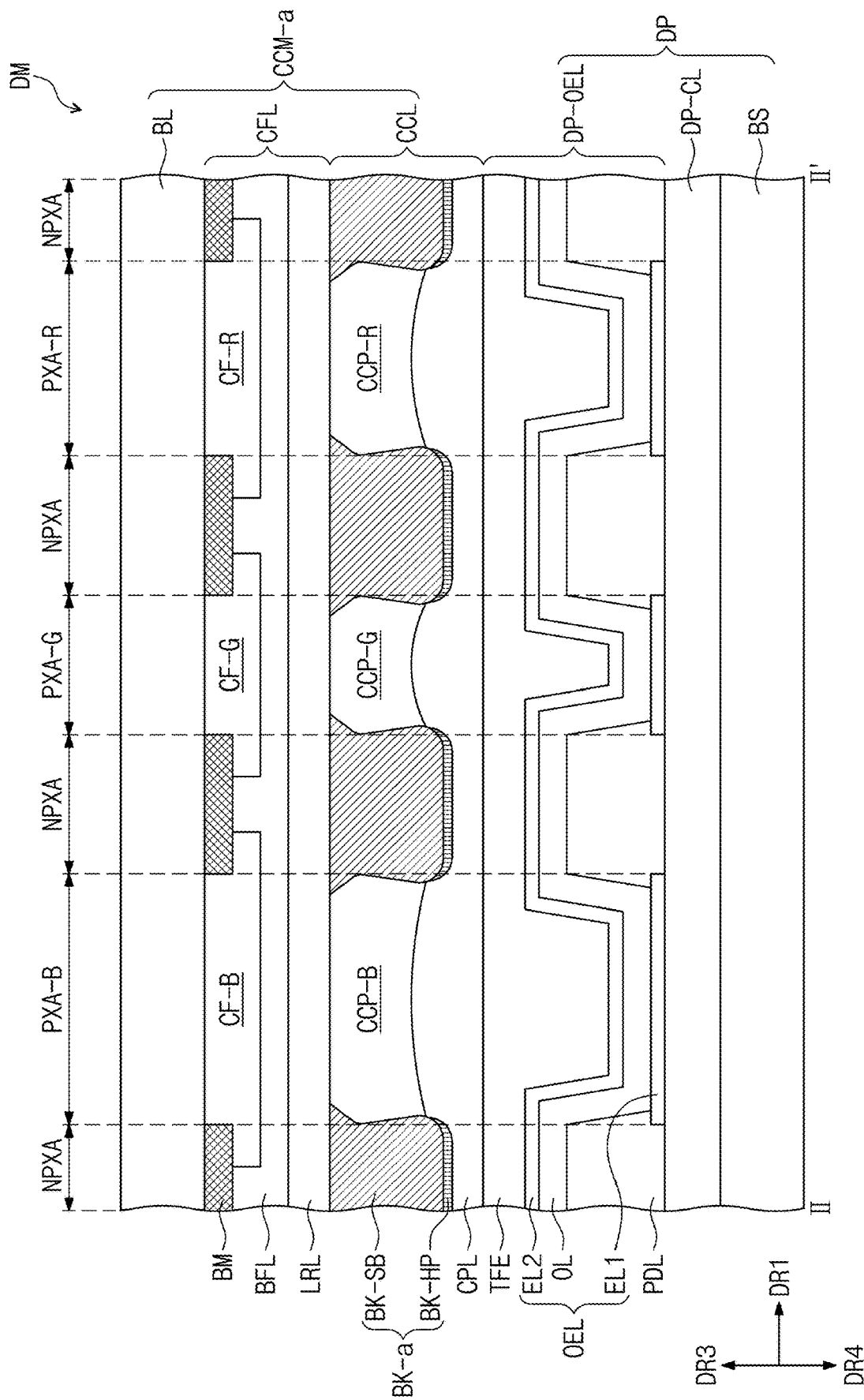
FIG. 13 is a cross-sectional view illustrating the display module according to an embodiment.

Hereinafter, FIGS. 12 and 13 are views illustrating an embodiment of the display module DM in the display device ES (refer to FIG. 1) according to an embodiment. FIG. 12 is an enlarged plan view illustrating a portion of the display module DM according to an embodiment. FIG. 13 is a cross-sectional view taken along line of FIG. 12 and illustrating the display module DM according to an embodiment.

An embodiment of the display module DM shown in FIGS. 12 and 13 is substantially the same as that in the display device ES a described in FIG. 1 and includes the display panel DP and the color conversion member CCM-a. The color conversion member CCM-a shown in FIG. 13 is substantially the same as those described above with reference to FIGS. 3 to 11E, and any repetitive detailed description thereof will hereinafter be omitted or simplified.

The display module DM according to an embodiment may include a display panel DP and a color conversion member CCM-a disposed on the display panel DP, and the color conversion member CCM-a may include a color conversion layer CCL and a color filter layer CFL. The color conversion member CCM-a may include a base layer BL, the color conversion layer CCL disposed below the base layer BL, and the color filter layer CFL disposed between the color conversion layer CCL and the base layer BL. In the color conversion member CCM-a, the color conversion layer may be disposed adjacent to the display panel DP.

The color conversion layer CCL-a may include a plurality of partition parts BK-a and color control parts CCP-B, CCP-G, and CCP-R disposed between the partition parts BK-a. The partition part BK-a may include a liquid-repellent part BK-HP disposed on a surface adjacent to the display panel DP and a base partition part BK-SB disposed adjacent to the base layer BL. FIG. 13 shows an embodiment where the display module DM includes the color conversion member CCM-a including the partition part BK-a described with reference to FIGS. 6 to 8, but not being limited thereto. Alternatively, the display module DM may include the color conversion member CCM including the partition part BK described with reference to FIGS. 3 and 4, for example.

Referring to FIGS. 12 and 13, the display module DM may include a non-light emitting area NPXA and light emitting areas PXA-B, PXA-G, and PXA-R. Each of the light emitting areas PXA-B, PXA-G, and PXA-R may emit light generated from an organic electroluminescence element OEL. The light emitting areas PXA-B, PXA-G, and PXA-R may have different surface areas, and the surface area may represent an area when viewed on a plane.

The light emitting areas PXA-B, PXA-G, and PXA-R may be distinguished or grouped into a plurality of groups according to colors of emitted light. Three light emitting areas PXA-B, PXA-G, and PXA-R that respectively emit blue light, green light, and red light are illustrated as an example in the display module DM according to an embodiment in FIGS. 12 and 13. In an embodiment, for example, the display device ES (refer to FIG. 1) according to an embodiment may include a blue light emitting area PXA-B, a green light emitting area PXA-G, and a red light emitting area PXA-R, which are distinguished from each other.

The display panel DP in the display module DM according to an embodiment in FIG. 13 includes the organic electroluminescence element OEL including an organic layer OL as a common layer. That is, the display panel DP in the display module DM according to an embodiment in FIG. 13 may emit light in the same wavelength region regardless of the light emitting areas PXA-B, PXA-G, and PXA-R. In an embodiment, for example, the display panel DP may provide the blue light that is the first color light through the color conversion member CCM-a.

In the display module DM according to an embodiment in FIGS. 12 and 13, the light emitting areas PXA-B, PXA-G, and PXA-R may have different surface areas from each other according to colors emitted from the color control parts CCP-B, CCP-G, and CCP-R. Referring to FIGS. 12 and 13, for example, in the display module DM according to an embodiment, the blue light emitting area PXA-B corresponding to the first color control part CCP-B that transmits the blue light therethrough may have a largest surface area, and the green light emitting area PXA-G corresponding to the second color control part CCP-G that transmits the green light therethrough may have a smallest surface area. However, the embodiment of the invention is not limited thereto. In an alternative embodiment, for example, the light emitting areas PXA-B, PXA-G, and PXA-R may emit light having a different color except for the blue light, the green light, and the red light, or the light emitting areas PXA-B, PXA-G, and PXA-R may have the same surface area or different surface area ratios as illustrated in FIG. 12.

The light emitting areas PXA-B, PXA-G, and PXA-R may be distinguished by a pixel defining layer PDL. The non-light emitting areas NPXA may be disposed between neighboring light emitting areas PXA-B, PXA-G, and PXA-R and correspond to the pixel defining layer PDL.

Referring to FIG. 12, the blue light emitting areas PXA-B and the red light emitting areas PXA-R may be alternately arranged in the first directional axis DR1 to constitute a first group PXG1. The green light emitting areas PXA-G may be arranged in the first directional axis DR1 to constitute a second group PXG2.

The first group PXG1 and the second group PXG2 may be spaced apart from each other in the second directional axis DR2. Each of the first group PXG1 and the second group PXG2 may be provided in plurality. The first groups PXG1 and the second groups PXG2 may be alternately arranged in the second directional axis DR2.

One green light emitting area PXA-G may be spaced apart from one blue light emitting area PXA-B or one red light emitting area PXA-R in a fifth directional axis DR5. A direction of the fifth directional axis DR5 may be a direction between the directions of the first and second directional axes DR1 and DR2.

An arrangement structure of the light emitting areas PXA-B, PXA-G, and PXA-R in FIG. 12 may be referred to as a pentile structure. However, the embodiment of the invention is not limited to the arrangement structure of the light emitting areas PXA-B, PXA-G, and PXA-R in the display module DM according to an embodiment in FIG. 12. In an alternative embodiment, for example, the light emitting areas PXA-B, PXA-G, and PXA-R may have a stripe structure in which the blue light emitting area PXA-B, the green light emitting area PXA-G, and the red light emitting area PXA-R are sequentially and alternately arranged.

Referring to FIG. 13, the display panel DP according to an embodiment may include a base substrate BS, a circuit layer DP-CL disposed on the base substrate BS, and a display element layer DP-OEL disposed on the circuit layer DP-CL. The display element layer DP-OEL may include a pixel defining layer PDL, an organic electroluminescence element OEL disposed between the pixel defining layers PDL, and a thin-film encapsulation layer TFE disposed on the organic electroluminescence element OEL.

The pixel defining layer PDL may include or be made of a polymer resin. In an embodiment, for example, the pixel defining layer PDL may include a polyacrylate-based resin or a polyimide-based resin. Also, the pixel defining layer PDL may further include an inorganic material in addition to the polymer resin. The pixel defining layer PDL may include a light absorbing material or a black pigment or dye. Also, the pixel defining layer PDL may be made of an inorganic material. In an embodiment, for example, the pixel defining layer PDL may include a silicon nitride (SiNx), a silicon oxide (SiOx), and a silicon oxynitride (SiOxNy). The pixel defining layer PDL may define the light emitting areas PXA-B, PXA-G, and PXA-R. The light emitting areas PXA-B, PXA-G, and PXA-R and the non-light emitting area NPXA may be distinguished by the pixel defining layer PDL.

The pixel defining layer PDL may overlap the partition part BK-a. That is, the plurality of pixel defining layers PDL may overlap the plurality of partition parts BK-a, respectively.

The organic electroluminescence element OEL may include a first electrode EL1 and a second electrode EL2, which face each other, and an organic layer OL disposed between the first electrode EL1 and the second electrode EL2. The organic layer OL may include a hole transport region, a light emitting layer, and an electron transport region. The hole transport region may include a hole injection layer adjacent to the first electrode EL1 and a hole transport layer disposed between the hole injection layer and the light emitting layer, and the electron transport region may include an electron injection layer adjacent to the second electrode EL2 and an electron transport layer disposed between the light emitting layer and the electron injection layer.

The thin-film encapsulation layer TFE may be disposed on the organic electroluminescence element OEL, particularly, on the second electrode EL2. The thin-film encapsulation layer TFE may be directly disposed on the second electrode EL2. The thin-film encapsulation layer TFE may be defined by or formed of a single layer or a plurality of layers that are laminated or disposed one on another.

As the display device according to an embodiment include the color conversion member disposed on the display panel, and the color conversion member includes the partition part including the liquid-repellent part on the top surface exposed to the display panel, the patterning quality and the coatability of the color control part may be improved to exhibit the high color quality and the improved durability. That is, the display device according to an embodiment may prevent color mixture between the color control parts to exhibit high color characteristics and increase the adhesion force between the color control part and the partition part to exhibit the improved durability by improving a pattern formation quality of the color control part such that the exposed top surface of the partition part has a lower surface energy value than the color control part, and the side surface of the partition part contacting the color control part has a higher surface energy value than the color control part.

Figure 14:
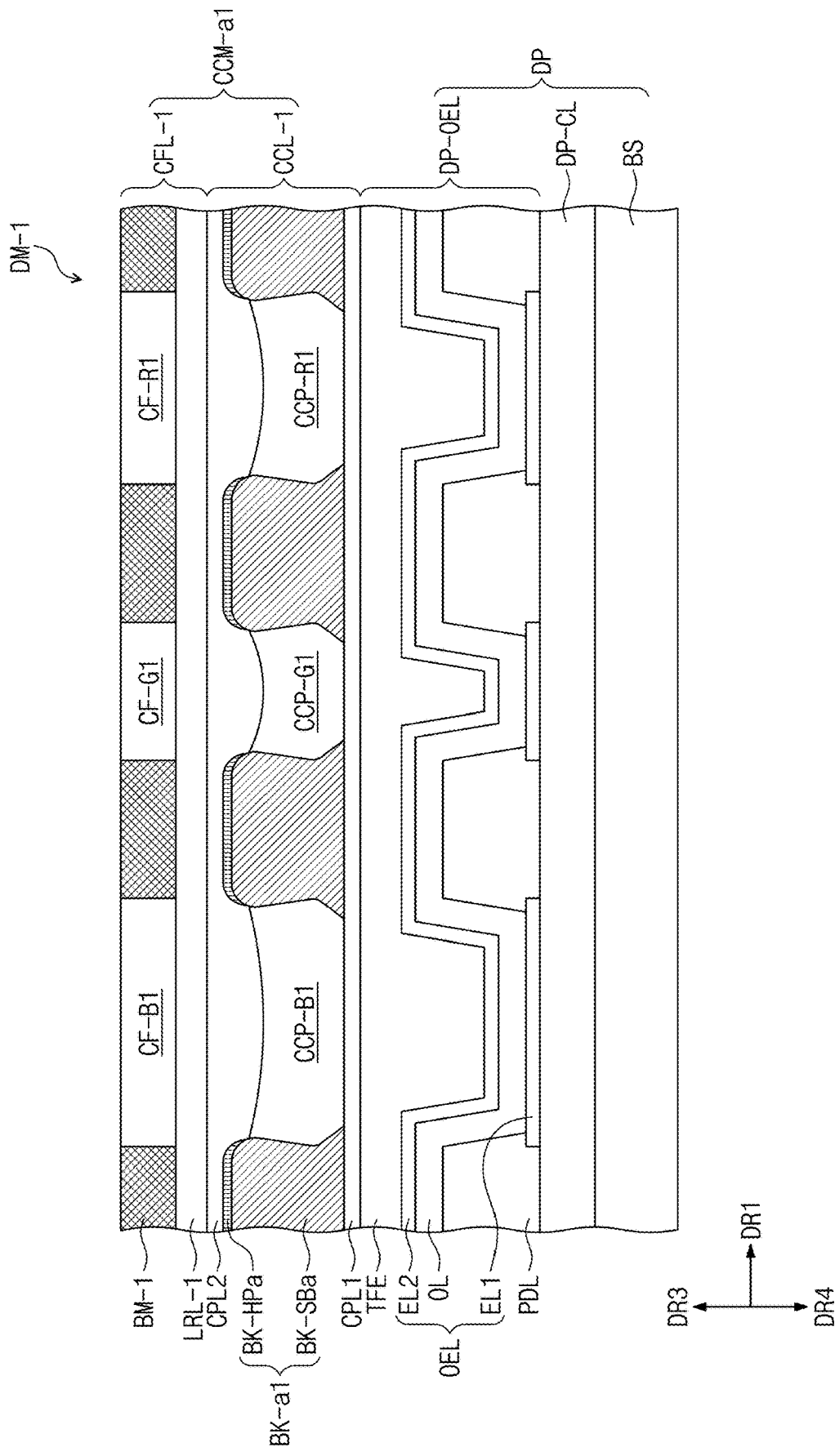
FIG. 14 is a cross-sectional view illustrating a display module according to an embodiment.

FIG. 14 is a cross-sectional view illustrating a display module DM-1 according to an embodiment. Hereinafter, the same or like elements in FIG. 14 as those described above will be designated by the same or similar reference numerals, and any repetitive detailed description thereof will be omitted or simplified.

Referring to FIG. 14, the display module DM-1 according to an embodiment may include a display panel DP and a color conversion member CCM-a1 disposed on the display panel DP, and the color conversion member CCM-a1 may include a color conversion layer CCL-1 and a color filter layer CFL-1. In the display module DM-1 according to an embodiment, the color conversion layer CCL-1 may be disposed on the display panel DP. The color conversion layer CCL-1 may be disposed on the display panel DP with a first capping layer CPL1 therebetween.

The color conversion layer CCL-1 of the color conversion member CCM-a1 may include a plurality of partition parts BK-a1 and color control parts CCP-B1, CCP-G1, and CCP-R1 disposed between the partition parts BK-a1. The partition part BK-a1 may include a base partition part BK-SBa disposed adjacent to the display panel DP and a liquid-repellent part BK-HPa disposed on the base partition part BK-SBa. The partition part BK-a1 may be provided by performing a process of forming the partition part in FIGS. 11A to 11E after the resin composition BK-P (refer to FIG. 11A) is provided on the first capping layer CPL1. That is, the partition part BK-a1 may be formed on the display panel DP through a continuous process. FIG. 14 shows an embodiment where the display module DM-1 includes the color conversion member CCM-a1 including a partition part structure described with reference to FIGS. 6 to 8, but not being limited thereto. Alternatively, the display module DM-1 may include the color conversion member CCM-1 including a partition part structure described with reference to FIGS. 3 and 4, for example. A second capping layer CPL2 for blocking the color control parts CCP-B1, CCP-G1, and CCP-R1 from being exposed to moisture/oxygen may be disposed on the plurality of partition parts BK-a1 and the color control parts CCP-B1, CCP-G1, and CCP-R1 disposed between the partition parts BK-a1.

The color filter layer CFL-1 may be disposed on the color conversion layer CCL-1. The color filter layer CFL-1 may include a low refractive layer LRL-1. The color filter layer CFL-1 may include a light shielding part BM-1 and filter parts CF-B1, CF-G1, and CF-R1. However, the embodiment of the invention is not limited thereto. In an alternative embodiment, for example, a portion of the low refractive layer LRL-1, the light shielding part BM-1, and the filter parts CF-B1, CF-G1, and CF-R1 in the color filter layer CFL-1 may be omitted. The color filter layer CFL-1 may be formed on the color conversion layer CCL-1 through a continuous process. That is, the color conversion layer CCL-1 and the color filter layer CFL-1 may be sequentially formed on the display panel DP through the continuous process in the display module DM according to an embodiment.

Although embodiments of the invention have been described, it is understood that the invention should not be limited to these exemplary embodiments but various changes and modifications can be made by one ordinary skilled in the art within the spirit and scope of the invention as hereinafter claimed.

Hence, the real protective scope of the invention shall be determined by the technical scope of the accompanying claims.

INDUSTRIAL APPLICABILITY

The partition parts are surface-treated to have the liquid repellency, thereby preventing the color mixture between the neighbored color control parts and improving the pattern formation quality in the color control parts applied to the display device. However, when the liquid repellency is applied to the entire surface of the partition parts, as the adhesion force between the color control part and the partition part decreases, the color control parts may not be stably coupled and separated from the color conversion member. Thus, the color control part may be patterned so that only the upper portions of the partition parts have the liquid repellency, and the stability and reliability of the color control part may be improved. Therefore, the invention has high industrial applicability.

The invention claimed is:

1. A color conversion member comprising:
   a base layer;
   a plurality of partition parts spaced apart from each other on the base layer; and
   a color control part disposed between the partition parts,
   wherein each of the partition parts has a first surface adjacent to the base layer, a second surface opposite to the first surface, and a third surface connected between the first surface and the second surface, wherein the third surface includes a recessed portion,
   wherein the third surface has a surface energy greater than a surface energy of the color control part, and the second surface has a surface energy less than the surface energy of the color control part, and
   wherein each of the partition parts comprises:
   a first sub-partition part having a width which gradually decreases in a direction from the first surface to the second surface;
   a second sub-partition part disposed on the first sub-partition part and having a width which gradually increases in a direction from the first sub-partition part to the second surface; and
   a liquid-repellent part disposed on the second sub-partition part and comprising a liquid-repellent additive.

2. The color conversion member of claim 1, wherein the liquid-repellent part has a surface energy less than the surface energy of the color control part, and
   each of the first sub-partition part and the second sub-partition part has a surface energy greater than the surface energy of the color control part.

3. The color conversion member of claim 1, wherein a top surface of the liquid-repellent part is the second surface, the second surface has the surface energy less than the surface energy of the third surface, and a difference between the surface energy of the second surface and the surface energy of the third surface is equal to or greater than about 10 dyn/cm.

4. The color conversion member of claim 1, wherein when a connected portion between the first sub-partition part and the second sub-partition part has a width of $W_1$, and the second sub-partition part has a maximum width of $W_2$, $W_1$ and $W_2$ satisfy the following inequation:

$$1.5 \ \mu m \leq W_2 - W_1 \leq 3.5 \ \mu m.$$

5. The color conversion member of claim 1, wherein when a connected portion between the first sub-partition part and the second sub-partition part has a width of $W_1$, the second sub-partition part has a maximum width of $W_2$, and a maximum height in a thickness direction of each of the partition parts is $H_{BK}$, $W_1$, $W_2$ and $H_{BK}$ satisfy the following inequation:

$$0.1 \leq (W_2 - W_1)/H_{BK} < 0.48.$$

6. The color conversion member of claim 1, wherein on a cross-section of each of the partition parts perpendicular to the base layer, a maximum width $W_3$ of the first sub-partition part is equal to or greater than a maximum width $W_2$ of the second sub-partition part.

7. The color conversion member of claim 1, wherein when a maximum height in a thickness direction of each of the partition parts is $H_{BK}$, and a maximum height in a thickness direction of the color control part is HCP, HBK and HCP satisfy the following inequation:

$$0.7*H_{BK} \le H_{CP} \le 1.3*H_{BK}.$$

8. The color conversion member of claim 1, wherein
a height in a thickness direction of each of the partition parts is equal to or greater than about 5 μm and equal to or less than about 20 μm, and
a height of the second sub-partition part is two times or more of a height of the first sub-partition part.

9. The color conversion member of claim 1, wherein each of the partition parts further comprises a third sub-partition part disposed between the second sub-partition part and the liquid-repellent part and having a width which gradually decreases in a direction from the second sub-partition part to the liquid-repellent part.

10. The color conversion member of claim 9, wherein an edge of a top surface of the third sub-partition part is a curved surface.

11. The color conversion member of claim 9, wherein on a cross-section of each of the partition parts perpendicular to the base layer,
the third sub-partition part comprises a flat portion having a flat top surface and a curved portion disposed on a side surface of the flat portion, and
the curved portion has a width which gradually decreases in the direction from the second sub-partition part to the liquid-repellent part.

12. The color conversion member of claim 11, wherein the curved portion comprises:
a first curved portion disposed at one side of the flat portion; and
a second curved portion symmetric to the first curved portion based on the flat portion and disposed at an opposing side of the flat portion.

13. The color conversion member of claim 11, wherein when, on the cross-section, the second sub-partition part has a maximum width of $W_2$, and the curved portion has a maximum width of $W_{CP}$, $W_2$ and $W_{CP}$ satisfy the following inequation:

$$W_{CP} \le 0.4*W_2.$$

14. The color conversion member of claim 11, wherein an edge of a top surface of the color control part overlaps the curved portion.

15. The color conversion member of claim 9, wherein when a maximum width of the second sub-partition part is $W_2$, and a maximum height from the second sub-partition part to a top surface of the third sub-partition part is $H_C$, $W_2$ and $H_C$ satisfy the following inequation:

$$0 \le H_C/(W_2/2) \le 0.5.$$

16. The color conversion member of claim 9, wherein a height in a thickness direction of the third sub-partition part is about 30% or less of a height in a thickness direction of each of the partition parts.

17. The color conversion member of claim 9, wherein each of the partition parts further comprises:
a fourth sub-partition part disposed on the third sub-partition part and having a width which gradually decreases in a direction from the third sub-partition part to the liquid-repellent part; and
a fifth sub-partition part disposed between the fourth sub-partition part and the liquid-repellent part and having a width which gradually increases in the direction from the third sub-partition part to the liquid-repellent part.

18. The color conversion member of claim 17, wherein when a connected portion between the fourth sub-partition part and the fifth sub-partition part has a width of $W_4$, the fifth sub-partition part has a maximum width of $W_5$, and a distance in a thickness direction from the third sub-partition part to a maximum height of the partition part is $H_{BK-3}$, $W_4$, $W_5$ and $H_{BK-3}$ satisfy the following inequation:

$$0.1 \le (W_5 - W_4)/H_{BK-3} < 0.48.$$

19. The color conversion member of claim 1, wherein the liquid-repellent additive is a copolymer comprising a perfluoropolyether (PFPE) derivative as a side chain.

20. The color conversion member of claim 1, wherein a weight of the liquid-repellent additive is equal to or greater than about 0.01 wt % and equal to or less than about 10 wt % based on a total weight of each of the partition parts.

21. The color conversion member of claim 1, wherein on a cross-section of each of the partition parts, a side surface of the second sub-partition part has an inclined angle greater than about 90° to the base layer.

22. The color conversion member of claim 1, wherein the color control part comprises a quantum dot.

23. The color conversion member of claim 1, wherein the color control part comprises:
a first color control part which transmits first color light therethrough;
a second color control part comprising a first quantum dot which converts the first color light into second color light in a longer wavelength region than the first color light; and
a third color control part comprising a second quantum dot which converts the first color light into third color light in a longer wavelength region than each of the first color light and the second color light.

24. The color conversion member of claim 1, wherein each of the partition parts comprises a pigment or a dye.

25. The color conversion member of claim 1, further comprising:
a color filter layer disposed between the base layer and the color control part,
wherein the color filter layer comprises:
a plurality of light shielding parts; and
a filter disposed between the light shielding parts.

26. The color conversion member of claim 25, wherein the light shielding parts overlap the partition parts, respectively.

* * * * *